(12) United States Patent
Ahn et al.

(10) Patent No.: US 12,550,365 B2
(45) Date of Patent: Feb. 10, 2026

(54) SEMICONDUCTOR DEVICE INCLUDING CONTACT PLUG

(71) Applicant: Samsung Electronics Co., Ltd., Suwon-si (KR)

(72) Inventors: Junhyeok Ahn, Suwon-si (KR); Sohyun Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 682 days.

(21) Appl. No.: 17/969,491

(22) Filed: Oct. 19, 2022

(65) Prior Publication Data
US 2023/0155024 A1 May 18, 2023

(30) Foreign Application Priority Data
Nov. 12, 2021 (KR) .......................... 10-2021-0155548

(51) Int. Cl.
| | | |
|---|---|---|
| *H10D 30/63* | (2025.01) | |
| *H10B 12/00* | (2023.01) | |
| *H10D 64/27* | (2025.01) | |
| *H10D 84/83* | (2025.01) | |
| *H10B 61/00* | (2023.01) | |

(52) U.S. Cl.
CPC .......... *H10D 30/63* (2025.01); *H10D 64/513* (2025.01); *H10D 84/83* (2025.01); *H10B 12/00* (2023.02); *H10B 61/22* (2023.02)

(58) Field of Classification Search
CPC ...... H10D 30/63; H10D 64/513; H10D 84/83; H10B 61/22; H10B 12/00
USPC ........................................................ 257/334
See application file for complete search history.

(56) References Cited

U.S. PATENT DOCUMENTS

| | | | |
|---|---|---|---|
| 6,175,129 B1 | 1/2001 | Liu et al. | |
| 9,184,227 B1 | 11/2015 | Kim et al. | |
| 9,425,200 B2 | 8/2016 | Hwang et al. | |
| 9,716,128 B2 | 7/2017 | Kim et al. | |
| 9,929,249 B1 | 3/2018 | Ahn et al. | |
| 11,538,812 B2 * | 12/2022 | Kim | H10B 12/485 |
| 12,016,175 B2 * | 6/2024 | Lee | H10B 12/482 |
| 2013/0292847 A1 | 11/2013 | Choi et al. | |
| 2021/0066304 A1 | 3/2021 | Kang et al. | |

FOREIGN PATENT DOCUMENTS

| | | |
|---|---|---|
| KR | 1020110001722 A | 1/2011 |
| KR | 1020130123687 A | 11/2013 |

* cited by examiner

*Primary Examiner* — Monica D Harrison
(74) *Attorney, Agent, or Firm* — Muir Patent Law, PLLC

(57) ABSTRACT

A semiconductor device includes a semiconductor substrate provided with active regions, an isolation layer defining each active region on the semiconductor substrate, gate electrodes overlapping the active regions and extending in a first direction parallel to an upper surface of the semiconductor substrate, an insulating barrier structure disposed at a level higher than a level of where the gate electrodes are disposed, the insulating barrier structure having a grid pattern including grid cells, bitlines extending in a second direction perpendicular to the first direction and parallel to the upper surface of the semiconductor substrate, and disposed at a level higher than a level of where the insulating barrier structure is disposed, and first contact plugs, each first contact plug being disposed in a corresponding grid cell of the grid cells of the insulating barrier structure.

20 Claims, 31 Drawing Sheets

SEMICONDUCTOR DEVICE INCLUDING CONTACT PLUG

CROSS-REFERENCE TO RELATED APPLICATION(S)

This application claims benefit of priority to Korean Patent Application No. 10-2021-0155548 filed on Nov. 12, 2021 in the Korean Intellectual Property Office, the disclosure of which is incorporated by reference herein in its entirety.

BACKGROUND

The present disclosure relates to a semiconductor device including a contact plug and a method of fabricating a semiconductor device.

Research on reducing sizes of elements constituting semiconductor devices and improving performance of the elements is in progress. For example, in a dynamic random access memory (DRAM), research for forming reliable and stable cell capacitors having reduced sizes is in progress.

SUMMARY

Example embodiments provide a semiconductor device including a reliable contact plug.

According to an example embodiment, a semiconductor device includes a semiconductor substrate provided with a plurality of active regions, an isolation layer defining each of the plurality of active regions on the semiconductor substrate, a plurality of gate trenches intersecting the plurality of active regions and extending to the isolation layer, a plurality of gate structures filling the plurality of gate trenches, respectively, and extending in a first direction parallel to an upper surface of the semiconductor substrate, an insulating barrier structure disposed on the plurality of active regions, the isolation layer, and the plurality of gate structures, a bitline extending in a second direction perpendicular to the first direction and parallel to the upper surface of the semiconductor substrate, and disposed at a level higher than a level of where the insulating barrier structure is disposed, and a plurality of first contact plugs, each first contact plug being between the bitline and a first portion of a corresponding active region of the plurality of active regions. The insulating barrier structure includes a plurality of first barrier patterns parallel to each other, overlapping the plurality of gate structures, and extending in the first direction, and a plurality of second barrier patterns parallel to each other and extending in a first diagonal direction between the first direction and the second direction, the first diagonal direction being parallel to the upper surface of the semiconductor substrate. Each of the plurality of first contact plugs is disposed in a region defined by a corresponding pair of first barrier patterns of the plurality of first barrier patterns and a corresponding pair of second barrier patterns of the plurality of second barrier patterns.

According to an example embodiment, a semiconductor device includes a semiconductor substrate provided with an active region, an isolation layer defining the active region on the semiconductor substrate, a gate trench intersecting the active region and extending to the isolation layer, a gate structure filling the gate trench and extending in a first direction parallel to an upper surface of the semiconductor substrate, an insulating barrier structure disposed on the active region, the isolation layer, and the gate structure, a bitline extending in a second direction perpendicular to the first direction and parallel to the upper surface of the semiconductor substrate, and disposed at a level higher than a level of the insulating barrier structure, and a first contact plug between the bitline and a first portion of the active region. The insulating barrier structure is disposed under the bitline. The insulating barrier structure includes a pair of first barrier patterns spaced apart from each other in the second direction, and a pair of second barrier patterns spaced apart from each other in the first direction. The pair of first barrier patterns are disposed between the pair of second barrier patterns. The first contact plug is disposed between the pair of first barrier patterns.

According to an example embodiment, a semiconductor device includes a semiconductor substrate provided with a plurality of active regions, an isolation layer defining each of the plurality of active regions on the semiconductor substrate, a plurality of gate trenches intersecting the plurality of active regions and extending to the isolation layer, a plurality of gate structures filling the plurality of gate trenches, respectively, and extending in a first direction parallel to an upper surface of the semiconductor substrate, a first impurity region and a second impurity region disposed in each of the plurality of active regions and spaced apart from each other, an insulating barrier structure disposed on the plurality of active regions, the isolation layer, and the plurality of gate structures, a bitline extending in a second direction perpendicular to the first direction and parallel to the upper surface of the semiconductor substrate, and disposed at a level higher than a level of where the insulating barrier structure is disposed, a first contact plug between the first impurity region and the bitline, a pad layer on the second impurity region, and a second contact plug on the pad layer. The insulating barrier structure comprises a pair of first barrier patterns extending in the first direction parallel to each other, and overlapping the plurality of gate structures, and a pair of second barrier patterns parallel to each other and extending in a first diagonal direction between the first direction and the second direction and parallel to the upper surface of the semiconductor substrate. The first contact plug is disposed in a region defined by the pair of first barrier patterns and the pair of second barrier patterns.

According to an embodiment of the present invention, a semiconductor device includes a semiconductor substrate provided with a plurality of active regions, an isolation layer defining each of the plurality of active regions on the semiconductor substrate, a plurality of gate electrodes overlapping the plurality of active regions and extending in a first direction parallel to an upper surface of the semiconductor substrate, an insulating barrier structure disposed at a level higher than a level of where the plurality of gate electrodes are disposed, the insulating barrier structure having a grid pattern including a plurality of grid cells, a plurality of bitlines extending in a second direction perpendicular to the first direction and parallel to the upper surface of the semiconductor substrate, and disposed at a level higher than a level of where the insulating barrier structure is disposed, and a plurality of first contact plugs, each first contact plug being disposed in a corresponding grid cell of the plurality of grid cells of the insulating barrier structure.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

In the descriptions below, terms "upper," "upper portion," "upper surface," "lower," "lower portion," "lower surface," "side surface," and the like, are used with reference to the diagrams unless otherwise indicated. It will be understood that, although the terms "first," "second," etc. may be used herein to describe various elements, these elements should not be limited by these terms. These terms are only used to distinguish one element from another. Thus, a "first element" could be termed a "second element" without departing from the teachings of example embodiments.

Figure 1A:
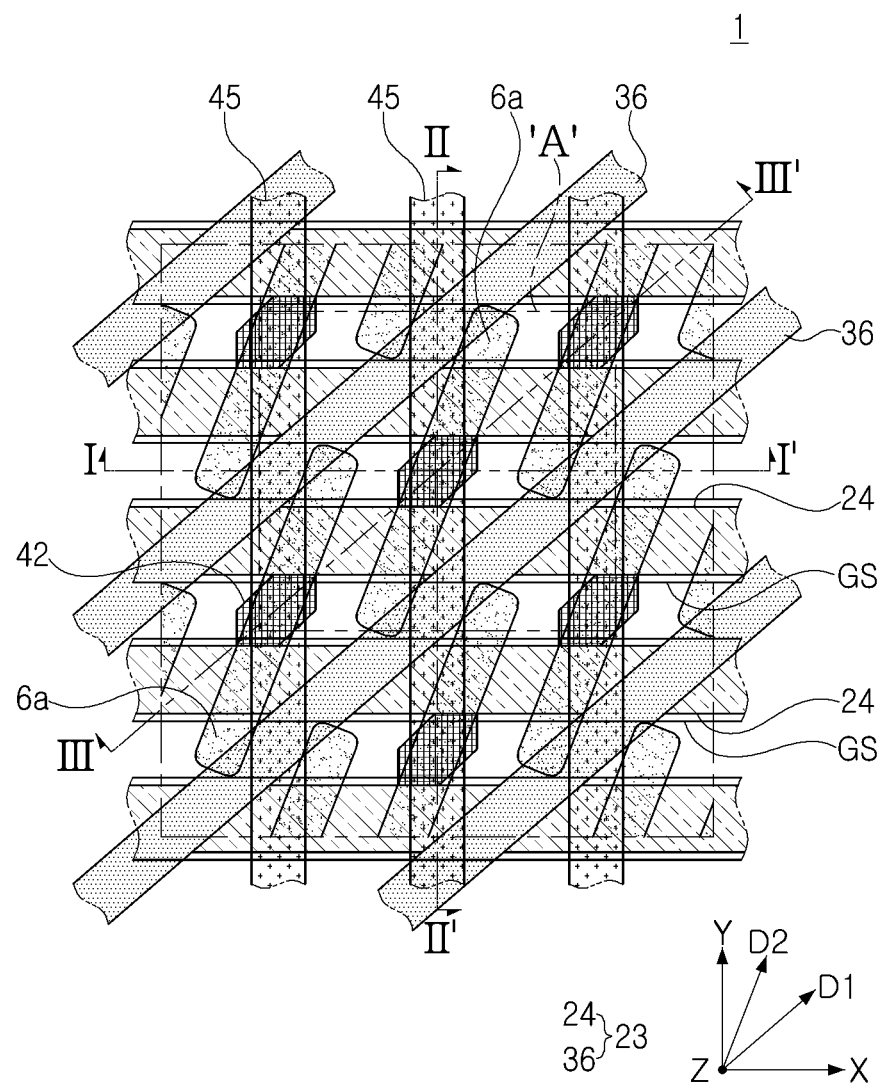
FIGS. 1A to 2 are diagrams illustrating an example of a semiconductor device according to an example embodiment.
Figure 1B:
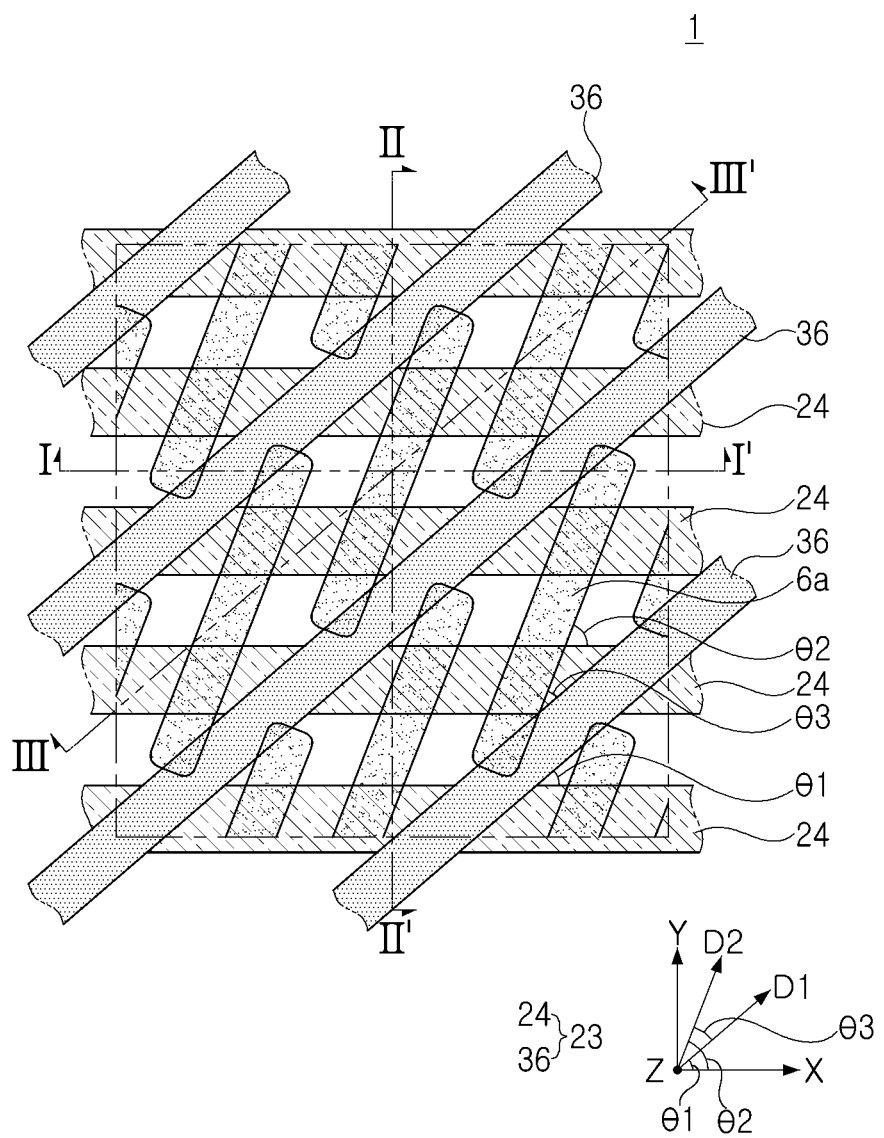
Figure 1C:
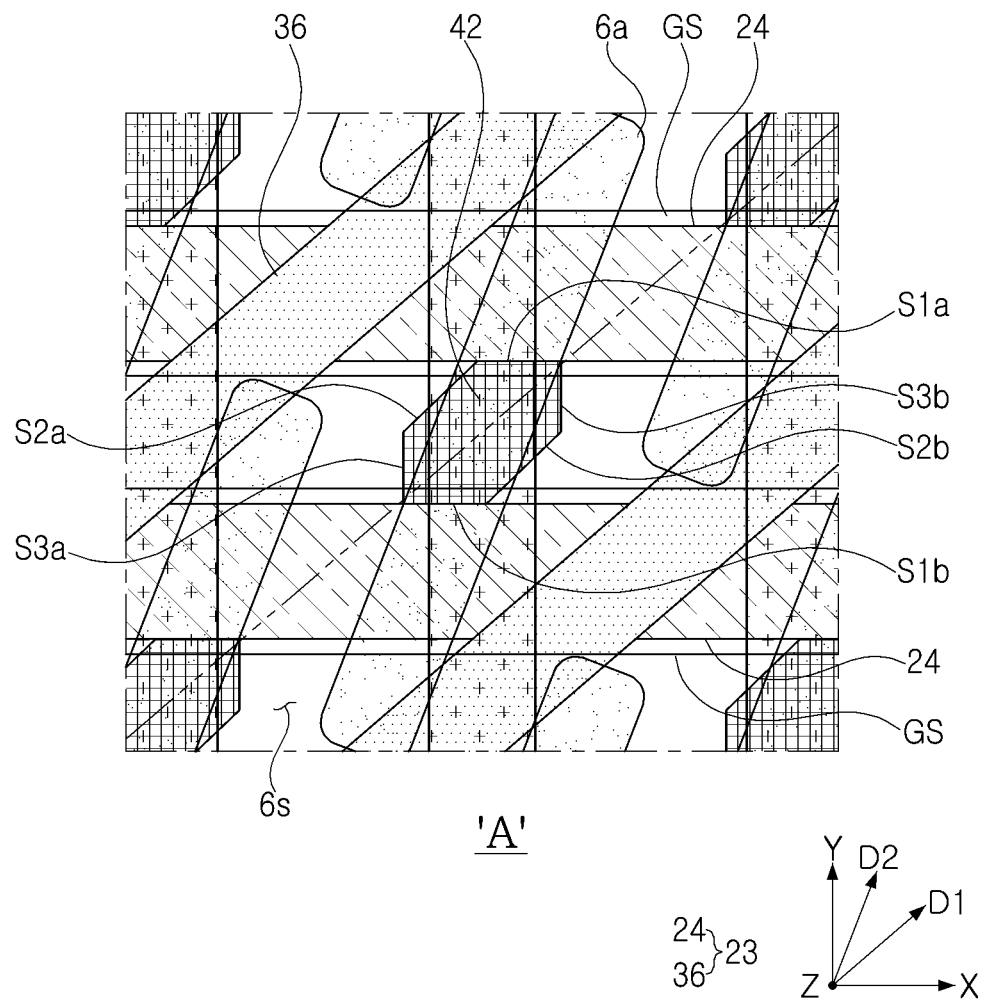
Figure 2:
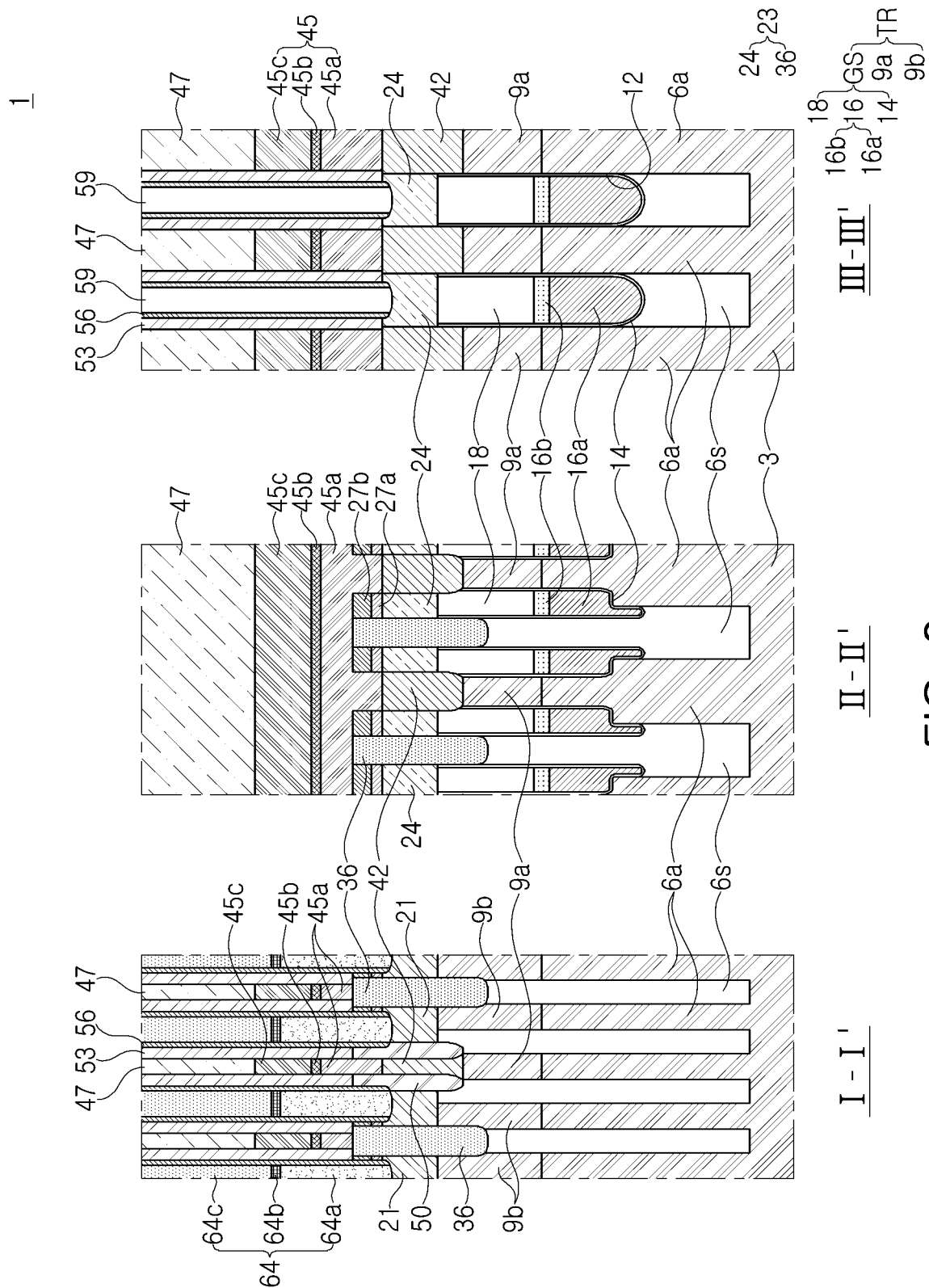

An example of a semiconductor device according to an example embodiment will be described with reference to FIGS. 1A, 1B, 1C, and 2. In the drawings, FIG. 1A is a plan view illustrating an example of a semiconductor device according to an example embodiment, FIG. 1B is a plan view illustrating some components in FIG. 1A, FIG. 1C is an enlarged view of region "A" of FIG. 1A, and FIG. 2 is a cross-sectional view illustrating regions taken along lines I-I', II-II', and III-III' of FIG. 1A.

Referring to FIGS. 1A, 1B, 1C, and 2, a semiconductor device 1 according to an example embodiment may include a semiconductor substrate 3, an isolation layer 6s, active regions 6a, cell transistors TR, a barrier structure 23, bitlines 45, first contact plugs 42, and second contact plugs 64.

The semiconductor substrate 3 may be a single-crystalline silicon substrate. The isolation layer 6s may define the active regions 6a on the semiconductor substrate 3. The active regions 6a may protrude from the semiconductor substrate 3 in a vertical direction Z, perpendicular to an upper surface of the semiconductor substrate 3. The active regions 6a may be formed of single-crystalline silicon. In an example embodiment, the active regions 6a may be formed of another semiconductor material, different from the single-crystalline silicon.

Each of the cell transistors TR may include a gate structure GS, a first impurity region 9a, and a second impurity region 9b. The gate structures GS may be disposed in gate trenches 12 intersecting the active regions 6a and extending to the isolation layer 6s. The gate trenches 12 may extend in a first direction X, parallel to the upper surface of the semiconductor substrate 3. Accordingly, the gate structure GS may extend in the first direction X. The gate structures GS may fill the gate trenches 12.

Each of the gate structures GS may include a gate dielectric layer 14 conformally covering an internal wall of the gate trench 12, a gate electrode 16 filling a portion of the gate trench 12 on the gate dielectric layer 14, and a gate capping layer 18 filling a remaining portion of the gate trench 12 on the gate electrode 16. The gate electrode 16 may include or may be formed of doped polysilicon, metal, a conductive metal nitride, a metal-semiconductor compound, a conductive metal oxide, graphene, a carbon nanotube, or combinations thereof. For example, the gate electrode 16 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, graphene, carbon nanotubes, or combinations thereof, but example embodiments are not limited thereto. The gate electrode 16 may include a single layer or multiple layers formed of the above-mentioned materials. For example, the gate electrode 16 may include a first electrode layer 16a, which may be formed of a metallic material, and a second electrode layer 16b which may be formed of doped polysilicon on the first electrode layer 16a. The gate capping layer 18 may include or may be formed of an insulating material, for example, a silicon nitride.

In each of the cell transistors TR, the first and second impurity regions 9a and 9b may be sources/drains. The first and second impurity regions 9a and 9b may have N-type conductivity. In each of the cell transistors TR, the first impurity region 9a and the second impurity region 9b may be disposed in the active region 6a on opposite sides of the gate structure GS.

The insulating barrier structure 23 may be disposed on the active regions 6a, the isolation layer 6s, and the gate structures GS.

The insulating barrier structure 23 may include first barrier patterns 24 and second barrier patterns 36. The first barrier patterns 24 and the second barrier patterns 36 may be formed of the same material. For example, the first barrier patterns 24 and the second barrier patterns 36 may be formed of an insulating material such as silicon nitride.

The first barrier patterns 24 may extend in the first direction X and may be parallel to each other. The first barrier patterns 24 may overlap the gate structures GS. The first barrier patterns 24 may be in contact with upper surfaces of the gate structures GS. The second barrier patterns 36 may extend in a first diagonal direction D1 and may be parallel to each other. The second barrier patterns 36 may extend in the first diagonal direction D1 while partially overlapping end portions of the active regions 6a, as illustrated in FIGS. 1A, 1B, and 1C. Each of the second barrier patterns 36 may have a line shape extending in the first diagonal direction D1 while penetrating through the first barrier patterns 24. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

In the first direction X, the first barrier patterns 24 may be separated from each other by the second barrier patterns 36.

The second barrier patterns 36 may have upper surfaces disposed at a level, different from that of upper surfaces of the first barrier patterns 24. For example, the upper surfaces of the second barrier patterns 36 may be disposed at a level, higher than that of the upper surfaces of the first barrier patterns 24. The second barrier patterns 36 may have lower surfaces disposed at a level, different from that of lower surfaces of the first barrier patterns 24. For example, the lower surfaces of the second barrier patterns 36 may be disposed at a level lower than that of the lower surfaces of the first barrier patterns 24. Accordingly, each of the first barrier patterns 24 may have a first upper surface and a first lower surface, and each of the second barrier patterns 36 may have a second upper surface, disposed at a level higher than a level of the first upper surface, and a second lower surface disposed at a level lower than a level of the first lower surface. The lower surfaces of the second barrier patterns 36 may be disposed at a level lower than that of an upper surface of the gate structure GS, and may be in contact with the isolation layer 6s.

The second barrier patterns 36 may have a greater vertical thickness than the first barrier patterns 24. For example, a vertical thickness of each of the second barrier patterns 36 may be greater than a vertical thickness of each of the first barrier patterns 24. The terms "vertical thickness" may refer to a thickness in the vertical direction Z.

The first contact plugs 42 may be disposed on first portions of the active regions 6a. The first portions of the active regions 6a may be portions in which the first impurity regions 9a are formed, respectively. Accordingly, the first contact plugs 42 may be in contact with the first impurity regions 9a on the first impurity regions 9a.

The first contact plugs 42 may be disposed at a level, higher than that of the lower surfaces of the second barrier patterns 36. Lower surfaces of the first contact plugs 42 may be disposed at a level, lower than that of the lower surfaces of the first barrier patterns 24.

Each of the first contact plugs 42 may have first side surfaces S1a and S1b opposite each other, second side surfaces S2a and S2b opposite each other, and third side surfaces S3a and S3b opposite each other.

In each of the first contact plugs 42, the first side surfaces S1a and S1b may be substantially parallel to side surfaces of the first barrier patterns 24, and the second side surfaces S2a and S2b may be substantially parallel to side surfaces of the second barrier patterns 36, and the third side surfaces S3a and S3b may be substantially parallel to side surfaces of the bitline 45. The first side surfaces S1a and S1b may be in contact with the first barrier patterns 24. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

In each of the first contact plugs 42, portions in which the first side surfaces S1a and S1b and the second side surfaces S2a and S2b meet may overlap the active region 6a. For example, the first side surfaces S1a and S1b and the second side surfaces S2a and S2b may be connected with each other on a region overlapping the active region 6a. Portions, in which the second side surfaces S2a and S2b and the third side surfaces S3a and S3b meet each other, may overlap the isolation layer 6s. For example, the second side surfaces S2a and S2b and the third side surfaces S3a and S3b may be connected with each other on a region overlapping the isolation layer 6s.

The second contact plugs 64 may be disposed on second portions of the active regions 6a. The second portions of the active regions 6a may be portions in which the second impurity regions 9b are formed, respectively. Accordingly, the second contact plugs 64 may overlap the second impurity regions 9b.

The semiconductor device 1 according to an example embodiment may further include pad layers 21 between the second contact plugs 64 and the second impurity regions 9b. For example, a corresponding pad layer of the pad layers 21 may be disposed between a corresponding one of the second contact plug 64 and a corresponding one of the second impurity region 9b. A vertical thickness of each of the pad layers 21 may be less than a vertical thickness of each of the second barrier patterns 36. Lower surfaces of the pad layers 21 may be coplanar with lower surfaces of the first barrier patterns 24. The pad layers 21 may be in contact with the barrier structure 23.

The pad layers 21 may be formed of doped polysilicon, for example, polysilicon having N-type conductivity. The pad layers 21 may be in contact with the second portions of the active regions 6a, for example, the second impurity regions 9b, and may overlap a portion of the isolation layer 6s. In an embodiment, the pad layers 21 may contact the isolation layer 6s.

Each of the second contact plugs 64 may include first to third conductive layers 64a, 64b, and 64c sequentially stacked on each other. The first conductive layer 64a may be formed of doped polysilicon, for example, polysilicon having N-type conductivity. The first conductive layer 64a may contact the pad layer 21. The second conductive layer 64b may include or may be formed of a metal-semiconductor compound layer. For example, the metal-semiconductor compound layer may include at least one of WSi, TiSi, TaSi, NiSi, and CoSi. The third conductive layer 64c may include or may be formed of a plug pattern and a conductive barrier layer covering side surfaces and bottom surfaces of the plug pattern. The conductive barrier layer may include or may be formed of at least one of TiN, TaN, WN, TiSiN, TaSiN, and RuTiN, and the plug pattern may include or may be formed of metal such as W.

The bitlines 45 may overlap the first contact plugs 42, and may extend in a second direction Y. The bitlines 45 may be parallel to each other. The second direction Y may be parallel to the upper surface of the semiconductor substrate 3, and may be perpendicular to the first direction X.

Each of the bitlines 45 may include first to third conductive layers 45a, 45b, and 45c sequentially stacked on each other. The first conductive layer 45a may be formed of doped polysilicon, for example, polysilicon having N-type conductivity. The second conductive layer 45b may include or may be formed of at least one of a metal-semiconductor compound layer and a conductive barrier layer. For example, the metal-semiconductor compound layer may include or may be formed of at least one of WSi, TiSi, TaSi, NiSi and CoSi, and the conductive barrier layer may include or may be formed of at least one of TiN, TaN, WN, TiSiN, TaSiN, and RuTiN. The third conductive layer 45c may include or may be formed of metal such as W.

In each of the bitlines 45, the first conductive layer 45a may be in contact with the first contact plugs 42.

The semiconductor device 1 according to an example embodiment may further include bitline capping layers 47 vertically aligned with the bitlines 45 on the bitlines 45. The bitline capping layer 47 may include or may be formed of an insulating material, for example, silicon nitride.

The semiconductor device 1 according to an embodiment may further include insulating fences 59. The insulating fences 59 may be disposed between the bitlines 45, between the bitline capping layers 47, and between the second contact plugs 64. The insulating fences 59 may be formed of an insulating material such as silicon nitride.

The semiconductor device 1 according to an example embodiment may further include bitline spacers 53, disposed on opposite side surfaces of the bitlines 45 and the bitline capping layers 47, and contact spacers 50 disposed below the bitline spacers 53 and disposed between at least the first contact plugs 42 and the first pad layers 21. The bitline spacers 53 may include an insulating material, for example, at least one of silicon oxide, silicon oxynitride, and silicon nitride. The contact spacers 50 may include an insulating material, for example, at least one of silicon oxide, silicon oxynitride, and silicon nitride.

The semiconductor device 1 according to an example embodiment may further include insulating liners 56 covering external surfaces of the bitline spacers 53. The insulating liners 56 may include or may be formed of an insulating material such as silicon nitride.

The semiconductor device 1 according to an embodiment may further include buffer insulating layers 27a and 27b disposed between the first barrier patterns 24 and the bitlines 45. The buffer insulating layers 27a and 27b may be a single layer or multiple layers. For example, the buffer insulating layers 27a and 27b may include a first buffer insulating layer 27a and a second buffer insulating layer 27b sequentially stacked on each other. The first buffer insulating layer 27a and the second buffer insulating layer 27b may be formed of different materials. For example, the first buffer insulating layer 27a may include or may be formed of silicon oxide, and the second buffer insulating layer 27b may include or may be formed of silicon oxynitride or silicon nitride. The second buffer insulating layer 27b may have an upper surface, coplanar with upper surfaces of the second barrier patterns 36. Upper surfaces of the second buffer insulating layer 27b may be disposed at a level, higher than that of upper surfaces of the first contact plugs 42.

Hereinafter, among the active regions 6a, one active region 6a will be described.

Among the gate structures GS, a pair of adjacent gate structures may intersect one active region 6a. Each of the gate structures GS may have a line shape extending along a straight line extending in the first direction X. The first direction X may be parallel to the upper surface of the semiconductor substrate 3.

The active region 6a may extend in a second diagonal direction D2 between the first direction X and the second direction Y.

The second diagonal direction D2 may be different from the first diagonal direction D1. The first diagonal direction D1 may form a first acute angle θ1 with the first direction X. The second diagonal direction D2 may form a second acute angle θ2, different from the first acute angle θ1. The first and second diagonal directions D1 and D2 may be parallel to the upper surface of the semiconductor substrate 3.

The first diagonal direction D1 and the second diagonal direction D2 may intersect each other while forming a third acute angle θ3. Accordingly, when viewed in a plan view, the second barrier patterns 36 may form the first acute angle θ1 with the first barrier patterns 24, the active region 6a may form the second acute angle θ2 with the first barrier patterns 24, and the active region 6a may form the third acute angle θ3 with the second barrier patterns 36.

The second acute angle θ2 may be greater than the first acute angle θ1.

The second acute angle θ2 may be greater than the third acute angle θ3.

The first acute angle θ1 may be greater than the third acute angle θ3.

According to the above-described embodiment, the barrier structure 23 may expose the first and second impurity regions 9a and 9b formed in the active region 6a, and reliability of the first and second contact plugs 42 and 64, which may be electrically connected to the first and second impurity regions 9a and 9b, may be improved. For example, the first contact plugs 42 may be spaced apart from each other by the barrier structure 23, and may be electrically connected with each other while being in contact with the first impurity regions 9a. For example, two or more the first contact plugs 42 that are electrically connected to the same bitline may be electrically connected with each other. Among the pad layers 21, adjacent pad layers may be spaced apart from each other by the barrier structure 23 and may contact the second impurity regions 9b. The second contact plugs 64 may be electrically connected to and in contact with the pad layers 21, respectively. Accordingly, the second contact plugs 64 may be stably electrically connected to the second impurity regions 9b through the pad layers 21.

According to the above-described embodiment, the barrier structure 23 may be disposed to form the first contact plugs 42 to have a uniform size. Thus, distribution characteristics of the semiconductor device 1 may be improved. For example, the barrier structure 23 may form a grid pattern defining a plurality of grid cells, and each of the first contact plugs 42 may be located in a corresponding grid cell of the plurality of grid cells. Each grid cell may be a region defined by (i.e., surrounded by) two adjacent first barrier patterns 24 and two adjacent second barrier patterns 36. In an embodiment, in each grid cell, the first contact plug 42, when viewed in a plan view, may contact the two adjacent first barrier patterns 24, and may be spaced apart from two adjacent second barrier patterns 36.

Hereinafter, various modified examples of the components of the above-described semiconductor device 1 will be described. The various modified examples of the components of the above-described semiconductor device 1 will be described with respect to modified or replaced components. In addition, although modifiable components to be described below will be described with reference to respective drawings, the modifiable components may be combined with each other to constitute the semiconductor device 1 according to an example embodiment.

Figure 3A:
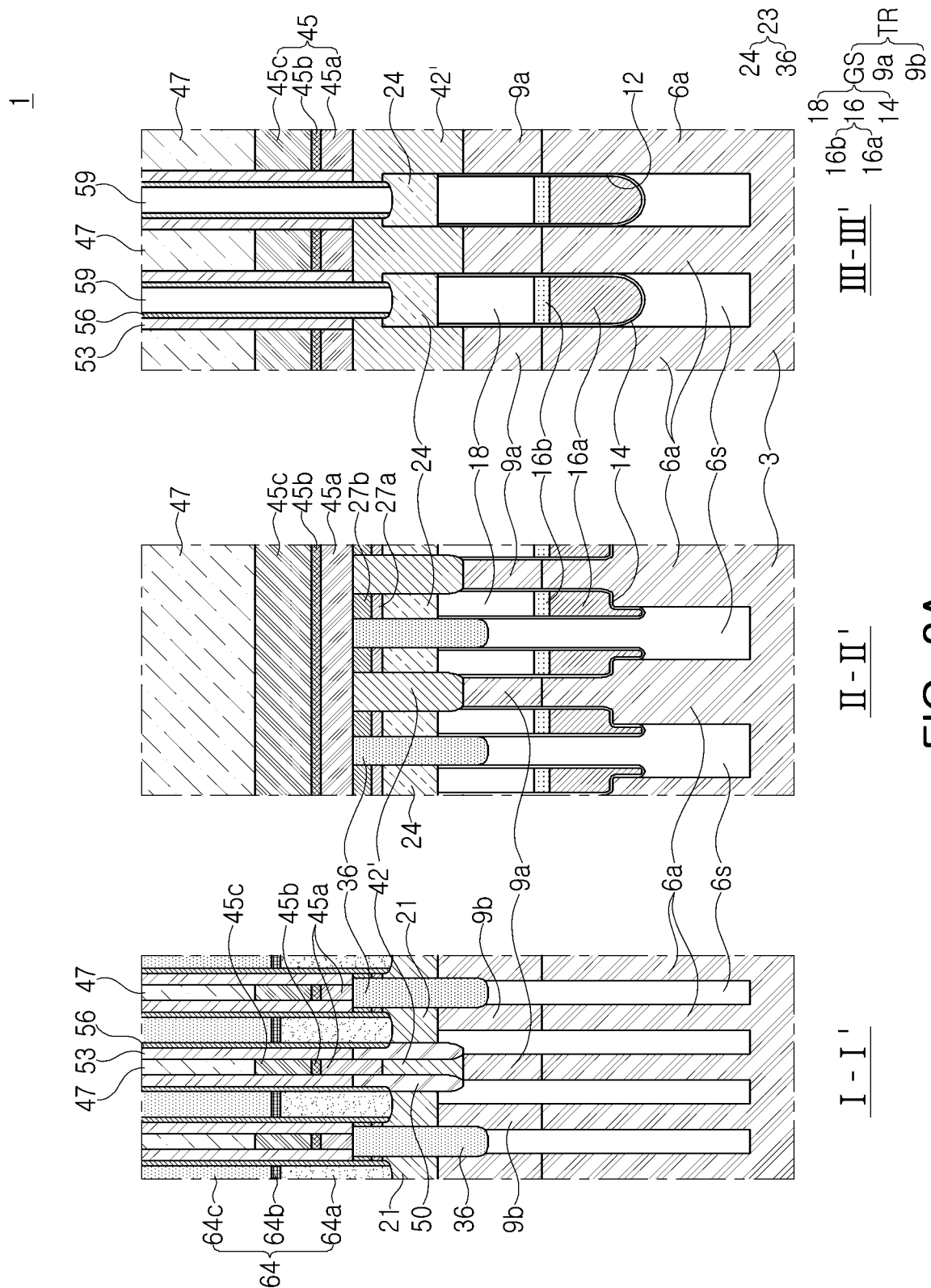
FIG. 3A is a cross-sectional view illustrating a modified example of a semiconductor device according to an example embodiment.
Figure 3B:
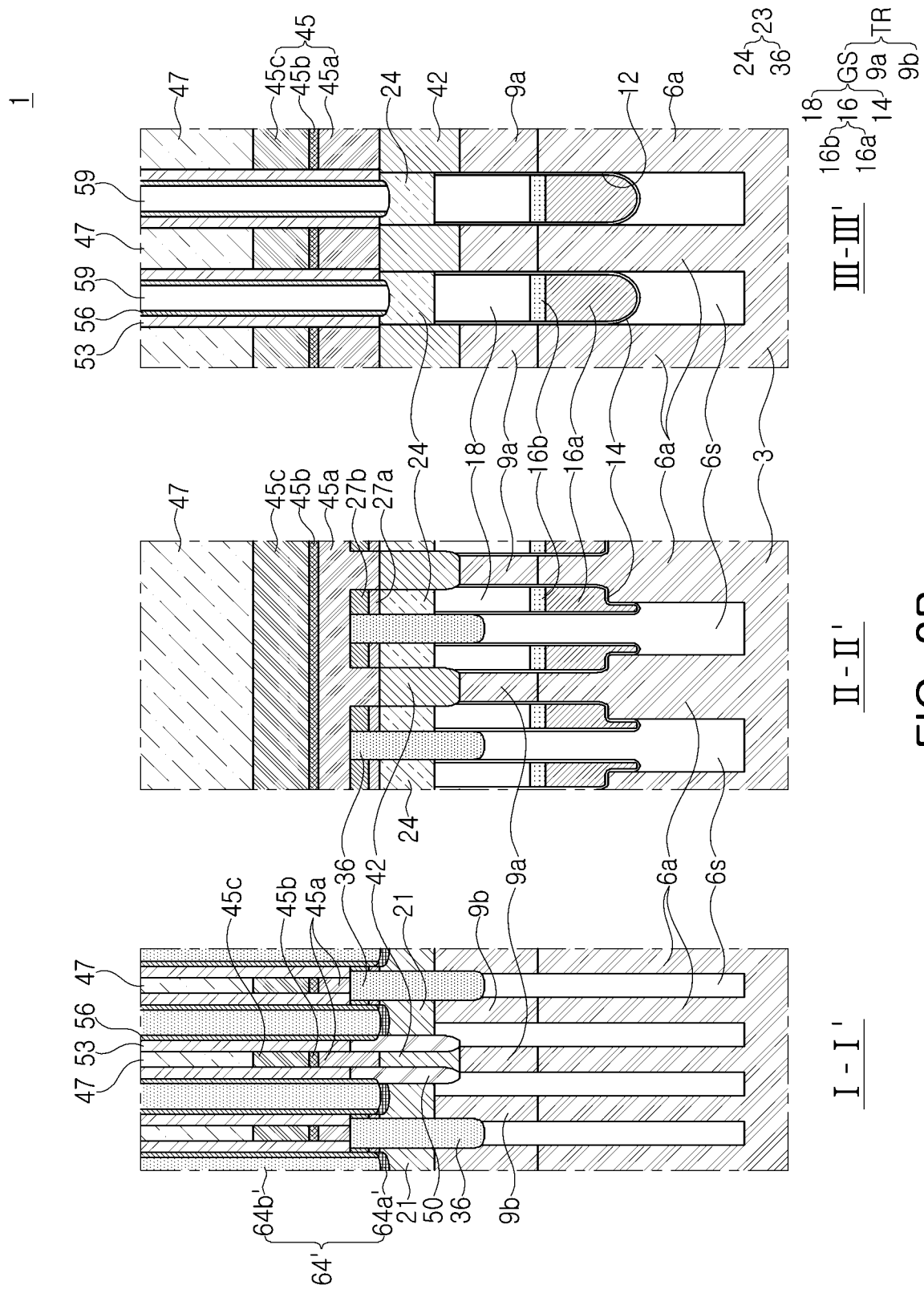
FIG. 3B is a cross-sectional view illustrating a modified example of a semiconductor device according to an example embodiment.

Modifiable or replaceable components in the above-described semiconductor device 1 will be described with reference to FIGS. 3A and 3B, respectively. FIG. 3A is a cross-sectional view illustrating a modified example of the first contact plugs (42 of FIG. 2) in the semiconductor device 1 according to an example embodiment, and illustrates regions taken along lines I-I', II-II', and III-III' of FIG. 1A. FIG. 3B is a cross-sectional view illustrating a modified example of the second contact plugs (64 of FIG. 2) in the semiconductor device 1 according to an example embodiment, and illustrates regions taken along lines I-I', II-II', and III-III' of FIG. 1A.

In a modified example, referring to FIG. 3A, first contact plugs 42' may be provided to replace the first contact plugs 42 in FIG. 2. The first contact plugs 42' may have upper surfaces disposed at a level higher than that of the first barrier patterns 24. The upper surfaces of the first contact plugs 42' may be coplanar with an upper surface of the second buffer insulating layer 27b.

In each of the first contact plugs 42', the first contact plug 42' may cover a side surface of the first barrier pattern 24 and may cover a portion of an upper surface of the first barrier pattern 24.

The first contact plugs 42' may have the same lower surfaces as the lower surfaces of the first contact plugs 42 in FIG. 2. The lower surfaces of the first contact plugs 42' may be in contact with first impurity regions 9a, and may be disposed at a level higher than that of lower surfaces of the second barrier patterns 36, and may be disposed at a level lower than that of the lower surfaces of the first barrier patterns 24.

In a modified example, referring to FIG. 3B, second contact plugs 64' may be provided to replace the second contact plugs 64 of FIG. 2. Each of the second contact plugs 64' may include first and second conductive layers 64a' and 64b' sequentially stacked on each other. The first conductive layer 64a' may be in contact with the pad layer 21, and may include or may be formed of a metal-semiconductor compound layer. For example, the metal-semiconductor compound layer may include or may be formed of at least one of WSi, TiSi, TaSi, NiSi, and CoSi. The second conductive layer 64b' may include a plug pattern and a conductive barrier layer covering a side surface and a bottom surface of the plug pattern. The conductive barrier layer may include or may be formed of at least one of TiN, TaN, WN, TiSiN, TaSiN, and RuTiN, and the plug pattern may include or may be formed of metal such as W.

Figure 4A:
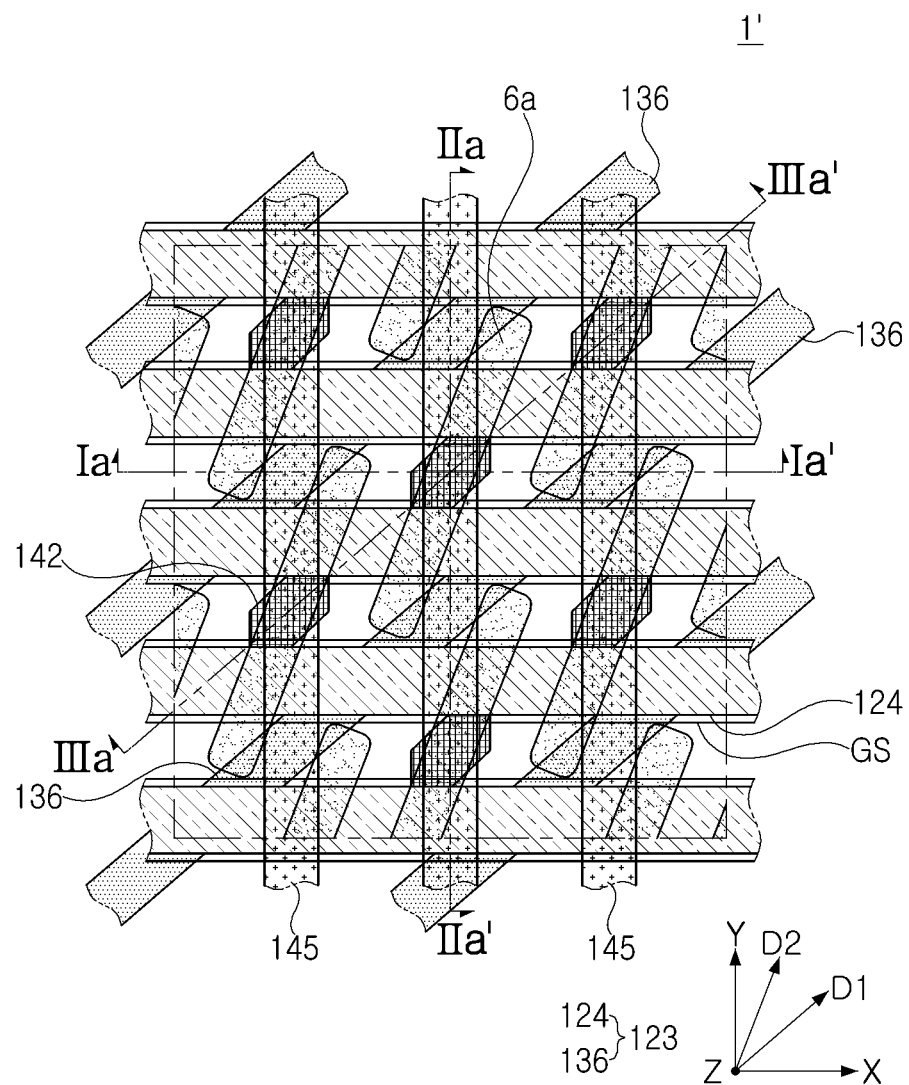
FIGS. 4A, 4B, and 5 are diagrams illustrating a modified example of a semiconductor device according to an example embodiment.

Next, a modified example of the semiconductor device according to an example embodiment will be described with reference to FIGS. 4A, 4B and 5. FIG. 4A is a plan view illustrating a modified example of the semiconductor device according to an example embodiment, FIG. 4B is a plan view illustrating some components of FIG. 4A, and FIG. 5 is a cross-sectional view illustrating regions taken along lines Ia-Ia', IIa-IIa', and IIIa-IIIa' of FIG. 4A.

Figure 4B:
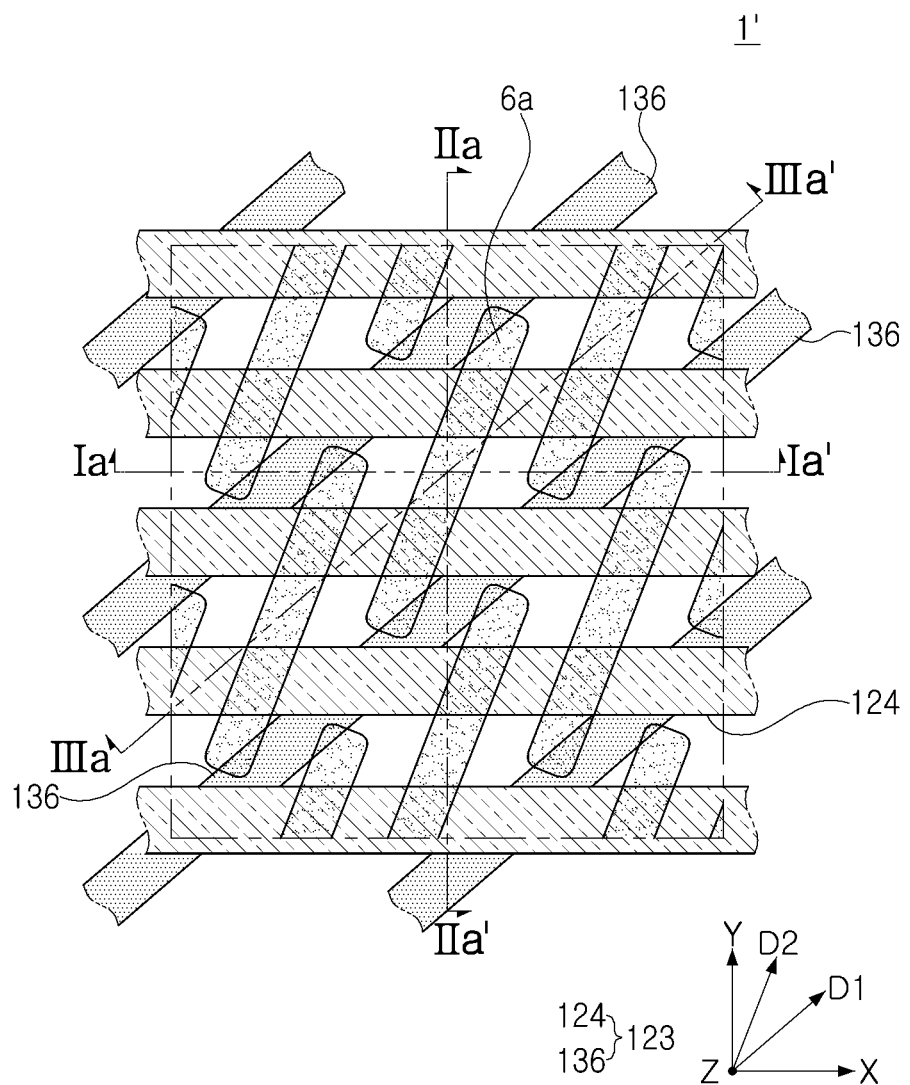
Figure 5:
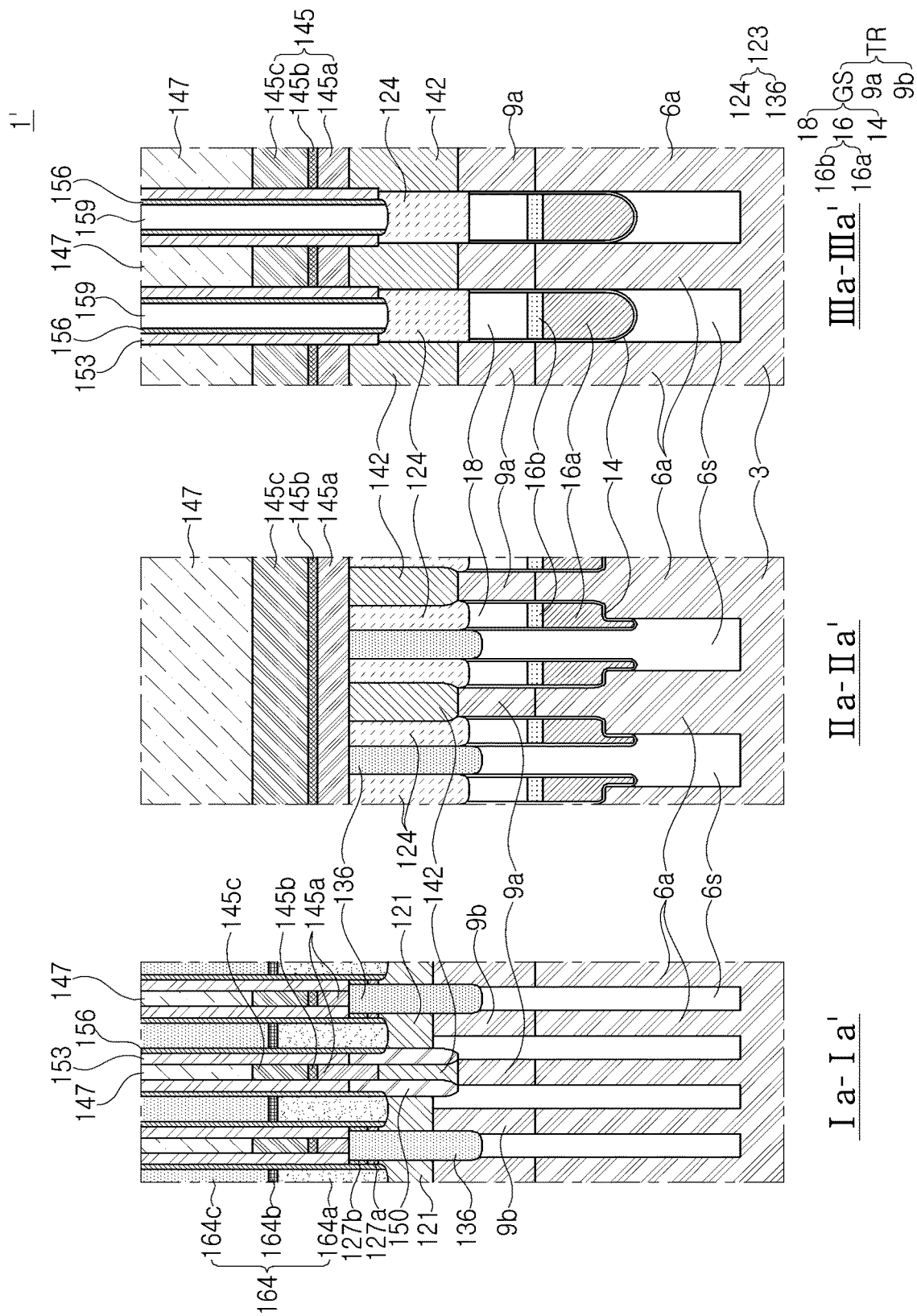

Referring to FIGS. 4A and 4B and FIG. 5, a semiconductor device 1' in the modified example may have substantially the same cell transistors TR, the active regions 6a, and the isolation layer 6s as described above.

The semiconductor device 1' may further include pad layers 121, an insulating barrier structure 123, first contact plugs 142, second contact plugs 164, bitlines 145, and bitline capping layers 147.

The pad layers 121 may be formed of the same material as the pad layers 21 in the same location as the pad layers 21 as described with reference to FIG. 2. For example, as illustrated in FIG. 2, the pad layers 121 may be in contact with the second portions of the active regions 6a, for example, the second impurity regions 9b. The second contact plugs 164 may be in contact with the pad layers 121 on the pad layers 121 in the same manner as the second contact plugs 64 of FIG. 2 as described with reference to FIG. 2. Each of the second contact plugs 164 may include first to third conductive layers 164a, 164b, and 164c, respectively corresponding to the first to third conductive layers (64a, 64b, and 64c of FIG. 2), sequentially stacked on each other, as described with reference to FIG. 2.

The insulating barrier structure 123 may include first barrier patterns 124 and second barrier patterns 136. The first barrier patterns 124 and the second barrier patterns 136 may be formed of the same material. For example, the first barrier patterns 124 and the second barrier patterns 136 may be formed of an insulating material such as silicon nitride.

When viewed in a plan view, a planar shape of the insulating barrier structure 123 may be substantially the same as a planar shape of the above-described insulating barrier structure 23 of FIGS. 1A to 1C.

The first barrier patterns 124 may extend in the first direction X and may be parallel to each other, similarly to the above-described first barrier patterns 24 of FIGS. 1A to 2. The first barrier patterns 124 may overlap the gate structures GS and may be in contact with upper surfaces of the gate structures GS. The second barrier patterns 136 may extend in the first diagonal direction D1 and may be parallel to each other, similarly to the above-described second barrier patterns 36 of FIGS. 1A to 2.

Each of the first barrier patterns 124 may have a line shape penetrating through the second barrier patterns 136 and extending in the first direction X. In the first diagonal direction D1, the second barrier patterns 136 may be separated from each other by the first barrier patterns 124.

Upper surfaces of the second barrier patterns 136 may be coplanar with upper surfaces of the first barrier patterns 124. The upper surfaces of the second barrier patterns 136 and the first barrier patterns 124 may be disposed at a level, higher than that of upper surfaces of the pad layers 121.

In an example, lower surfaces of the second barrier patterns 136 may be disposed at a level different from that of lower surfaces of the first barrier patterns 124. For example, the lower surfaces of the second barrier patterns 136 may be disposed at a level, lower than that of the lower surfaces of the first barrier patterns 124, but example embodiments are not limited thereto. For example, the lower surfaces of the second barrier patterns 136 may be disposed at a level, higher level than that of the lower surfaces of the first barrier patterns 124.

In an example embodiment, the lower surfaces of the second barrier patterns 136 may be disposed at substantially the same level as the lower surfaces of the first barrier patterns 124.

The semiconductor device 1' may further include buffer insulating layers 127a and 127b disposed between the second barrier patterns 136 and the second contact plugs 164 on the pad layers 121. The buffer insulating layers 127a and 127b may include a first buffer insulating layer 127a and a second buffer insulating layer 127b sequentially stacked on each other. The first buffer insulating layer 127a may be formed of silicon oxide, and the second buffer insulating layer 127b may be formed of silicon oxynitride or silicon nitride.

The first contact plugs 142 may be formed of the same material as the first contact plugs 42 as described with reference to FIG. 2. When viewed in a plan view, a planar shape of the first contact plugs 142 may be substantially the same as a planar shape of the first contact plugs 42 of FIGS. 1A and 1C as described with reference to FIGS. 1A and 1C. The first contact plugs 142 may be in contact with the first portions of the active regions 6a, for example, the first impurity regions 9a, similarly to the first contact plugs 42 as described with reference to FIG. 2.

Lower surfaces of the first contact plugs 142 may be disposed on a level, higher than that of the lower surfaces of the second barrier patterns 136 and the first barrier patterns 124.

Upper surfaces of the first contact plugs 142 may be disposed at substantially the same level as the upper surfaces of the second barrier patterns 136 and the first barrier patterns 124.

The bitlines 145 may include first to third conductive layers 145a, 145b, and 145c, sequentially stacked on each other, which may respectively correspond to the first to third conductive layers 45a, 45b, and 45c, sequentially stacked on each other, as described with reference to FIG. 2. The bitline capping layers 147 may be vertically aligned with the bitlines 145 and may be disposed on the bitlines 145.

The semiconductor device 1' may further include insulating fences 159, bitline spacers 153, contact spacers 150, and insulating liners 156, respectively corresponding to the insulating fences 59, the bitline spacers 53, the contact spacers 50, and the insulating liners 56 as described with reference to FIG. 2.

Figure 6:
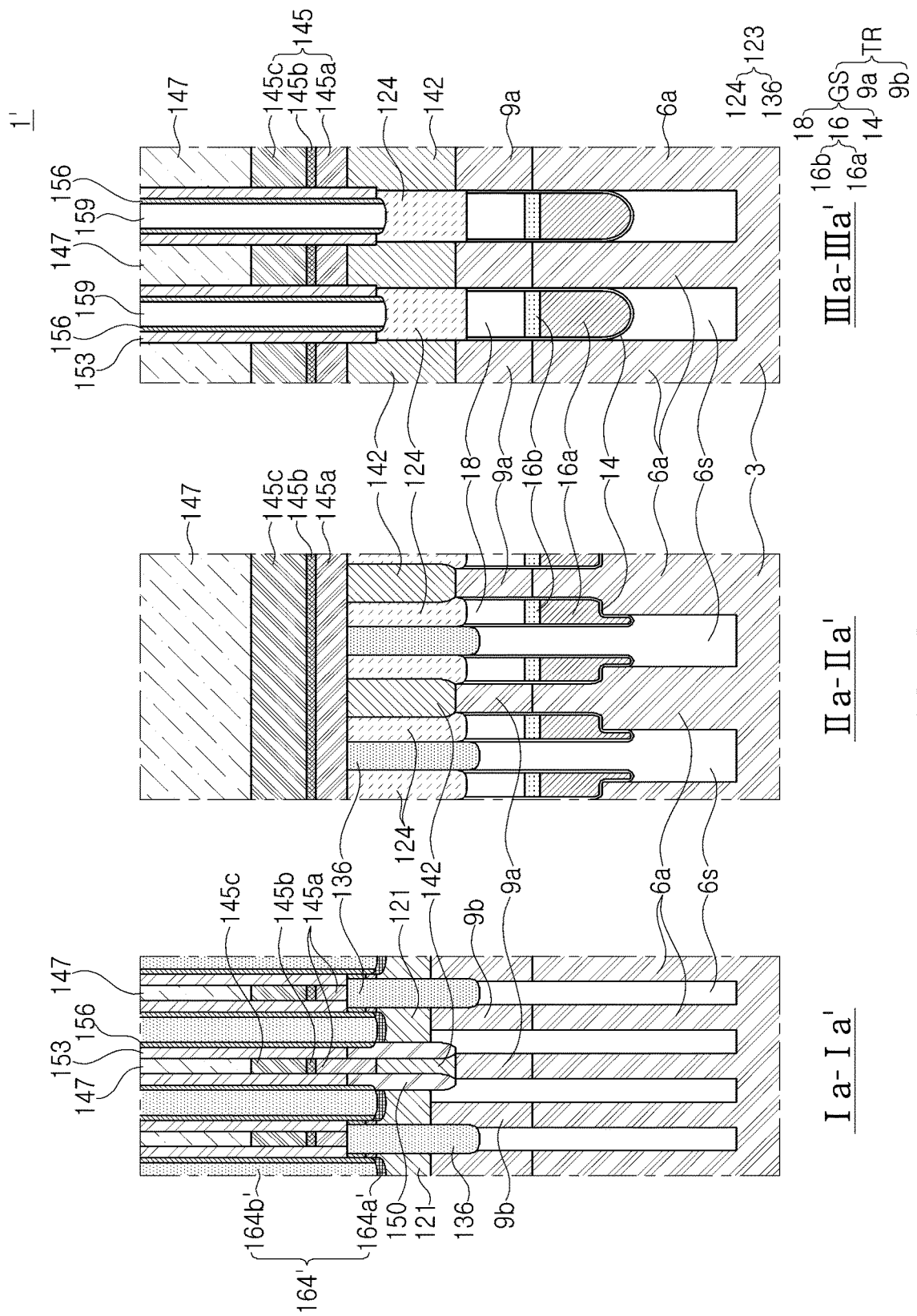
FIG. 6 is a cross-sectional view illustrating a modified example of a semiconductor device according to an example embodiment.

Next, a modified example of the second contact plugs (164 of FIG. 5) in the semiconductor device 1' will be described with reference to FIG. 6. FIG. 6 is a cross-sectional view illustrating a modified example of the second contact plugs (164 of FIG. 5) in the semiconductor device 1', and may illustrate regions taken along lines Ia-Ia', IIa-IIa', and IIIa-IIIa'.

In a modified example, referring to FIG. 6, second contact plugs 164' may be provided to replace the second contact plugs 164 of FIG. 5. The second contact plugs 164' may be substantially the same as the second contact plugs 64' as described with reference to FIG. 3B. For example, each of the second contact plugs 164' may include first and second conductive layers 164a' and 164b' sequentially stacked on each other. The first conductive layer 164a' may be in contact with the pad layer 121, and may include a metal-semiconductor compound layer. The second conductive layer 164b' may include a plug pattern and a conductive barrier layer covering a side surface and a bottom surface of the plug pattern.

Next, exemplary examples of the method of forming the semiconductor device 1 described with reference to FIGS. 1A to 2 will be described with reference to FIGS. 7 to 15. In the drawings, FIG. 7 is a process flowchart illustrating a method of forming a semiconductor device according to an example embodiment, FIGS. 8A, 9A, 10A, and 11 are schematic plan views illustrating a method of forming a semiconductor device according to an example embodiment, and FIGS. 8B, 9B, 10B, 12A, 12B, 13, 14, and 15 are schematic cross-sectional views of regions taken along lines I-I', II-II', and III-III' of FIG. 1A for illustrating a method of forming a semiconductor device according to an example embodiment.

Figure 7:
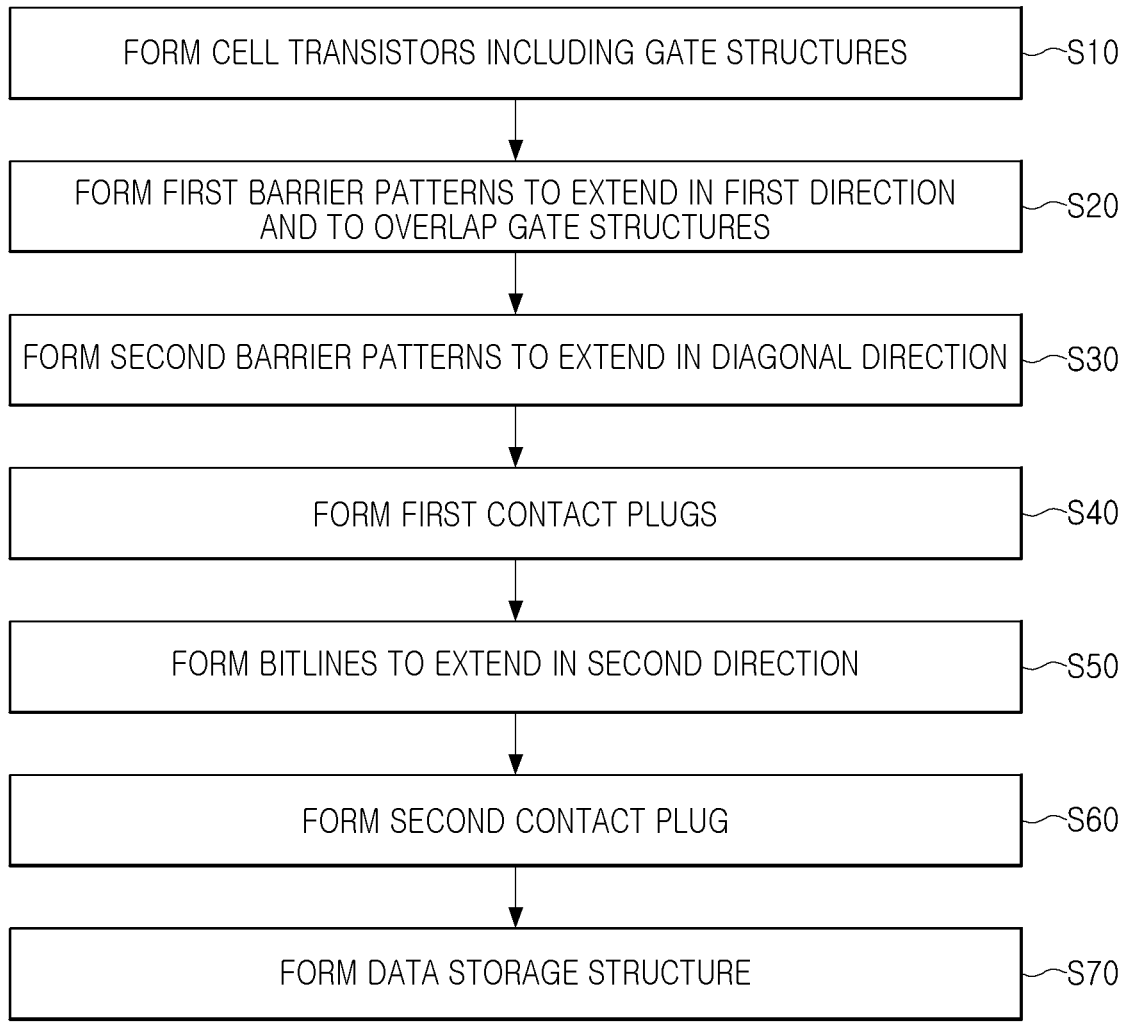
FIGS. 7 to 15 are diagrams illustrating an example of a method of forming a semiconductor device according to an example embodiment.
Figure 8A:
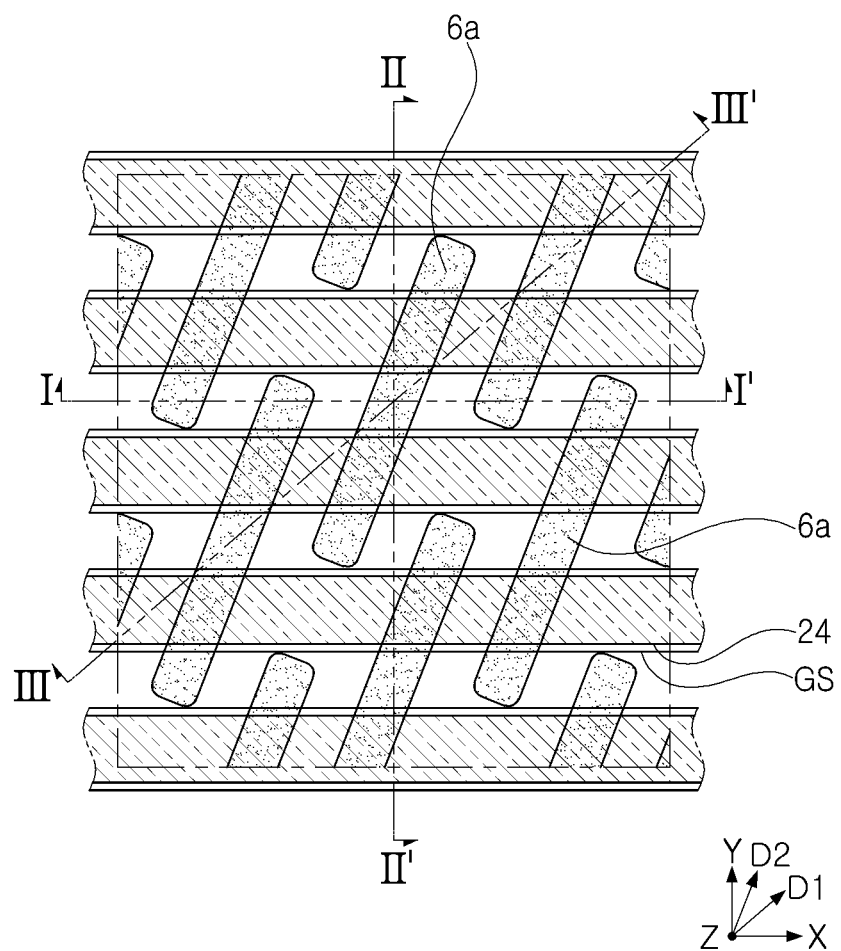
Figure 8B:
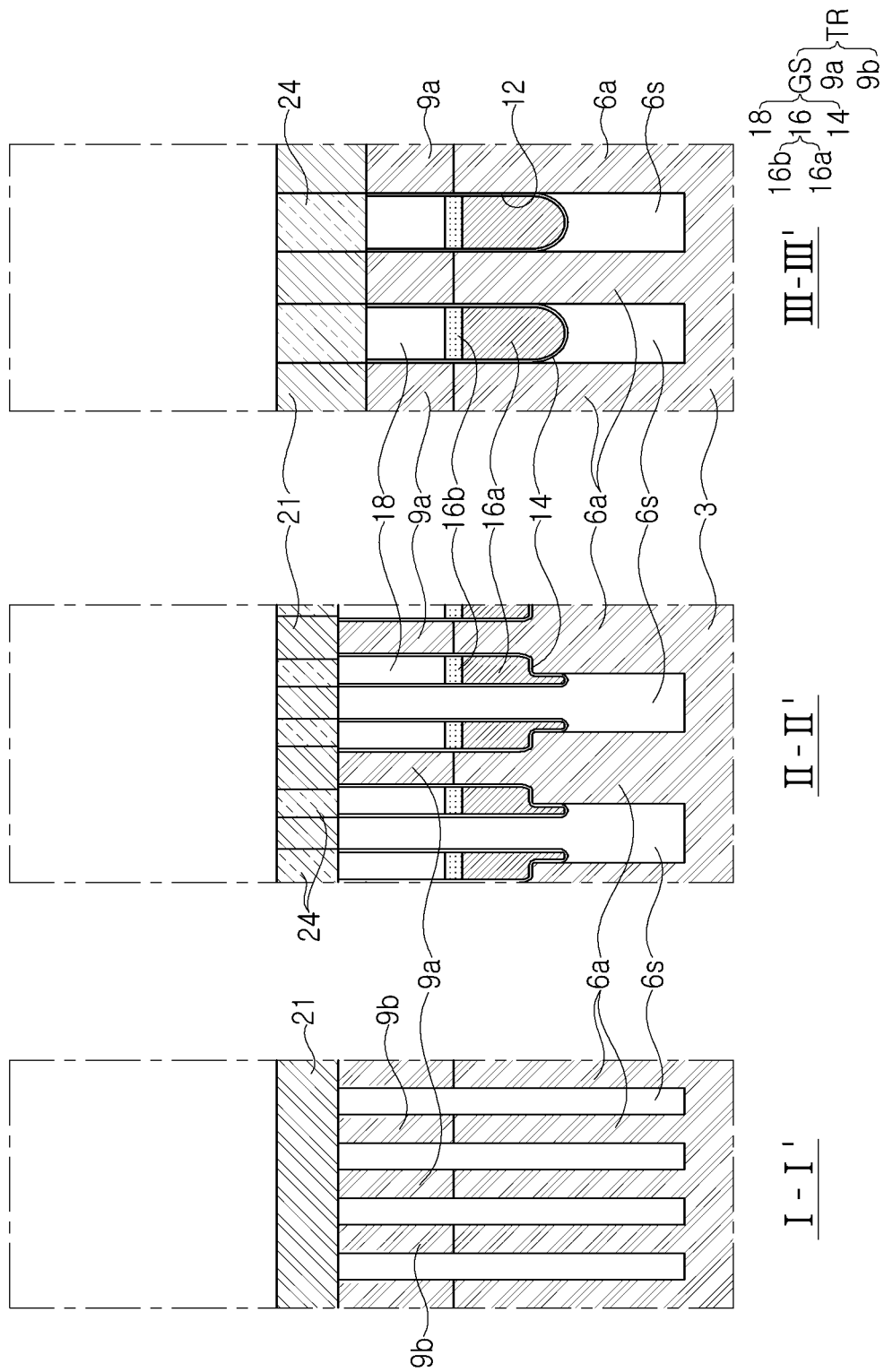

Referring to FIGS. 7, 8A, and 8B, cell transistors TR including cell gate structures GS may be formed. The cell transistors TR may be formed on a semiconductor substrate 3. The semiconductor substrate 3 may be formed of a semiconductor material such as silicon.

Forming the cell transistors TR may include forming an isolation layer 6s to define active regions 6a on the semiconductor substrate 3, forming gate trenches 12 intersecting the active regions 6a and extending to the isolation layer 6s, and forming cell gate structures GS, respectively filling the gate trenches 12.

Each of the cell gate structures GS may include a gate dielectric layer 14 conformally covering an internal wall of the gate trench 12, and a gate electrode 16 filling a portion of the gate trench 12 on the gate dielectric layer 14, and a gate capping layer 18 filling a remaining portion of the gate trench 12 on the gate electrode 16.

The gate electrode 16 may include a single layer or multiple layers. For example, the gate electrode 16 may include a first electrode layer 16a, which may be formed of a metallic material, and a second electrode layer 16b which may be formed of doped polysilicon on the first electrode layer 16a. The gate capping layer 18 may be formed of an insulating material, for example, silicon nitride.

The forming of the cell transistors TR may further include forming the first and second impurity regions 9a and 9b in the active regions 6a through an ion implantation process. The first and second impurity regions 9a and 9b may be sources/drains.

In an example embodiment, the first and second impurity regions 9a and 9b may be formed before the isolation layer 6s is formed.

In an example embodiment, the first and second impurity regions 9a and 9b may be formed after the isolation layer 6s is formed and before the gate trenches 12 are formed.

In an example embodiment, the first and second impurity regions 9a and 9b may be formed after the gate structures GS are formed.

The active regions 6a may be formed of single-crystalline silicon. The active regions 6a may have P-type conductivity, and the first and second impurity regions 9a and 9b may have N-type conductivity.

A pad layer 21 may be formed on the semiconductor substrate 3 including the cell transistors TR. The pad layer 21 may cover the cell transistors TR and the isolation layer 6s.

The pad layer 21 may be formed as a silicon layer, for example, a doped polysilicon layer. The pad layer 21 may have the same conductivity type as the first and second impurity regions 9a and 9b, for example, N-type conductivity.

In operation S20, first barrier patterns 24 may be formed to extend in a first direction X and to overlap the cell gate structures GS. The first barrier patterns 24 may be formed of an insulating material (e.g., silicon nitride), different from that of the isolation layer 6s.

In an example, the first barrier patterns 24 may be formed after the pad layer 21 is formed. The first barrier patterns 24 may intersect the pad layer 21, and may penetrate through the pad layer 21.

In an example embodiment, the pad layer 21 may be formed after the first barrier patterns 24 are formed. The pad layer 21 may fill a space between the first barrier patterns 24.

Figure 9A:
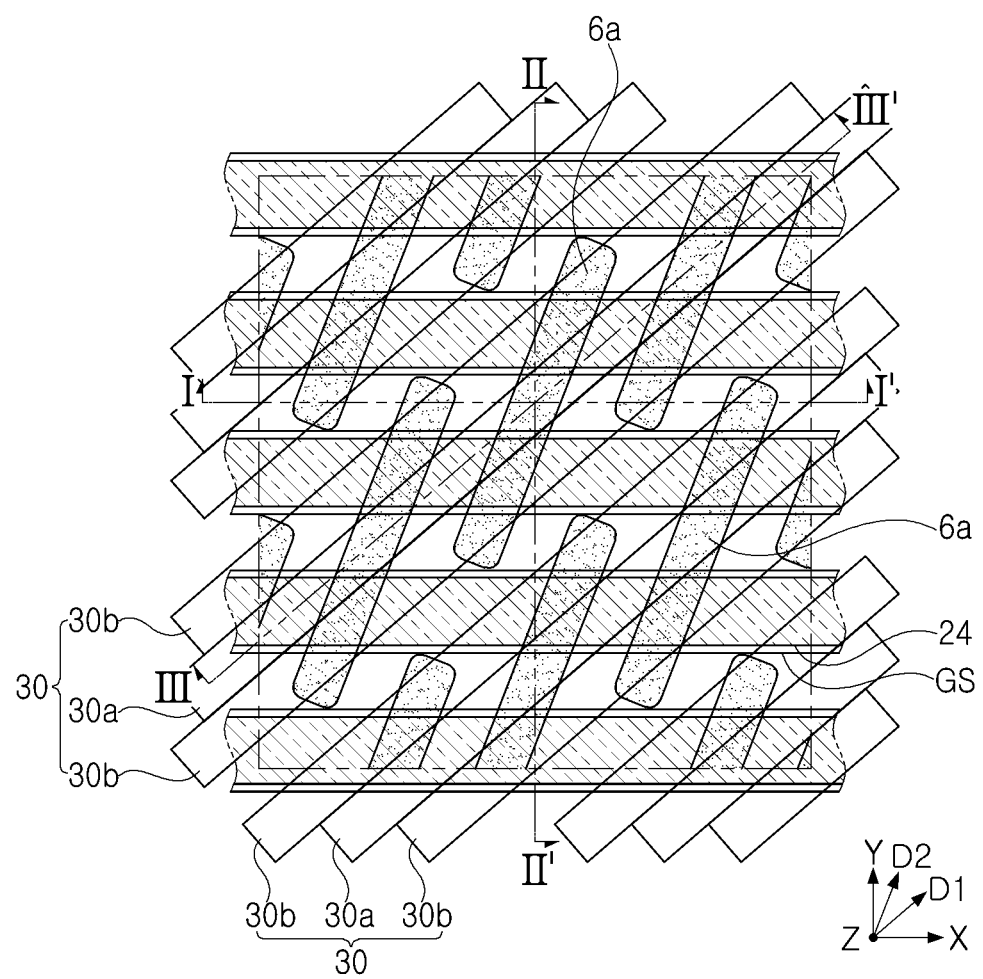
Figure 9B:
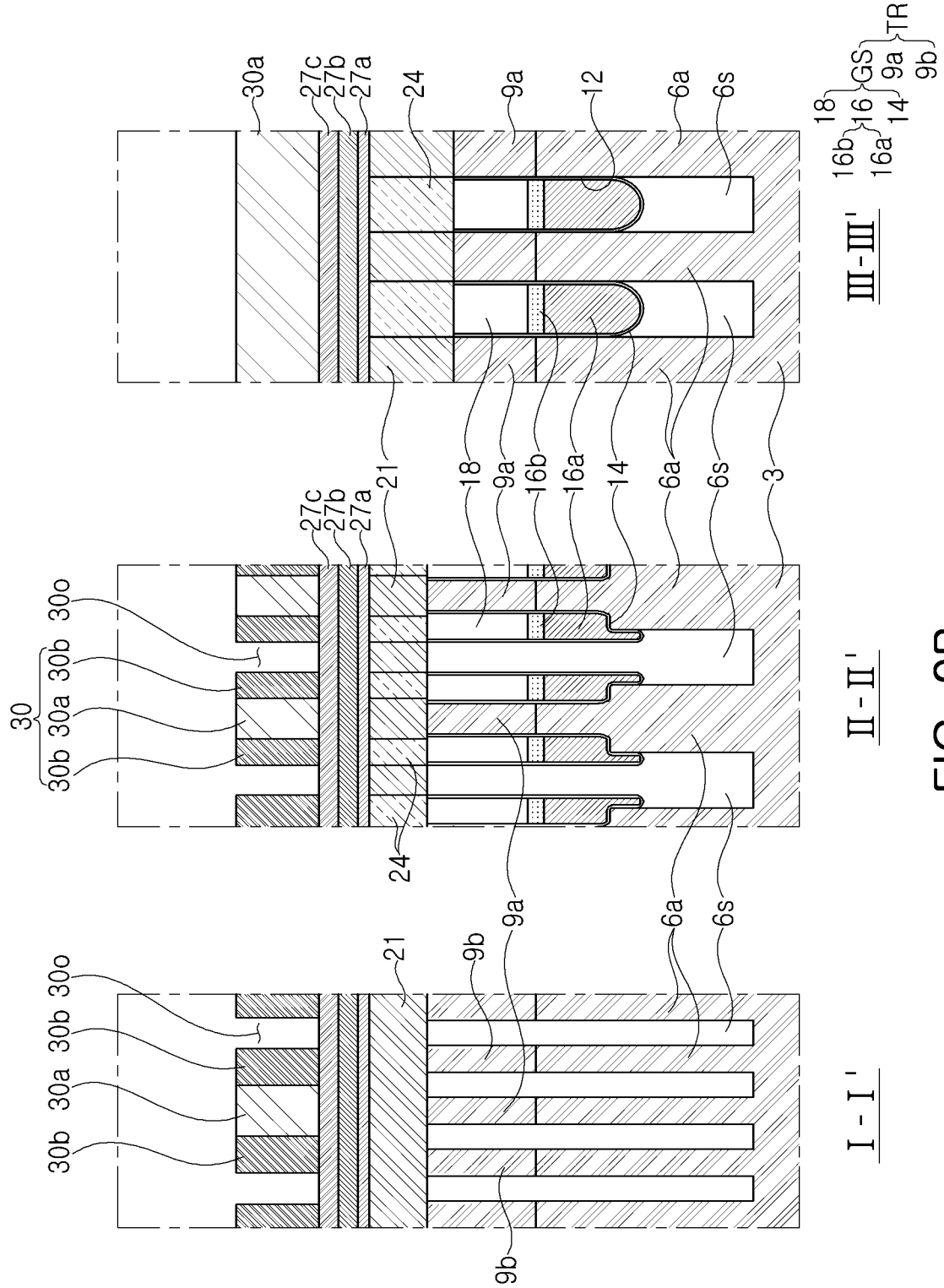

Referring to FIGS. 7, 9A, and 9B, a first buffer insulating layer 27a, a second buffer insulating layer 27b, and a third buffer insulating layer 27c may be formed to be sequentially stacked on the first barrier patterns 24 and the pad layer 21. The first and third buffer insulating layers 27a and 27c may be formed of silicon oxide, and the second buffer insulating layer 27b may be formed of silicon nitride.

First mask patterns 30 may be formed on the third buffer insulating layer 27c. Each of the first mask patterns 30 may include a mask line 30a, extending in a diagonal direction D1, and mask spacers 30b covering opposite side surfaces of the mask line 30a. The mask spacers 30b may be formed of a material, different from that of the mask line 30a.

Line-shaped mask openings 30o may be formed between the first mask patterns 30 to extend in the diagonal direction D1.

Figure 10A:
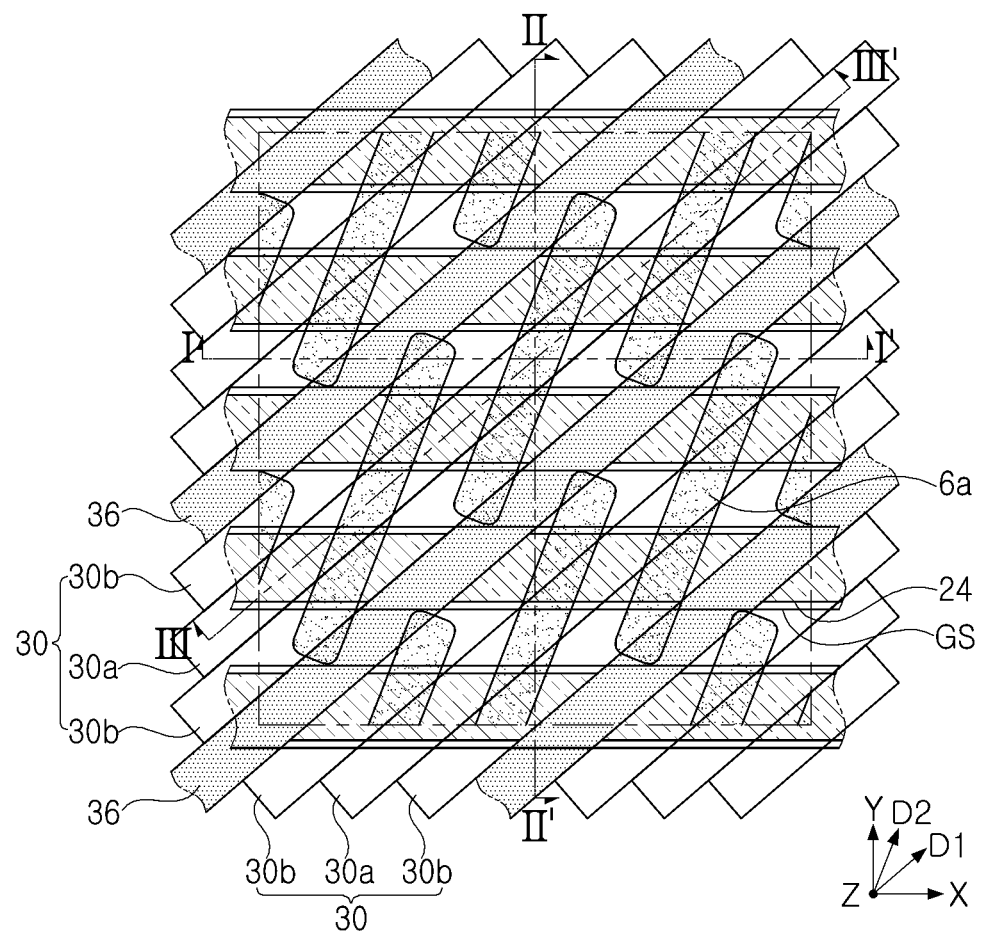
Figure 10B:
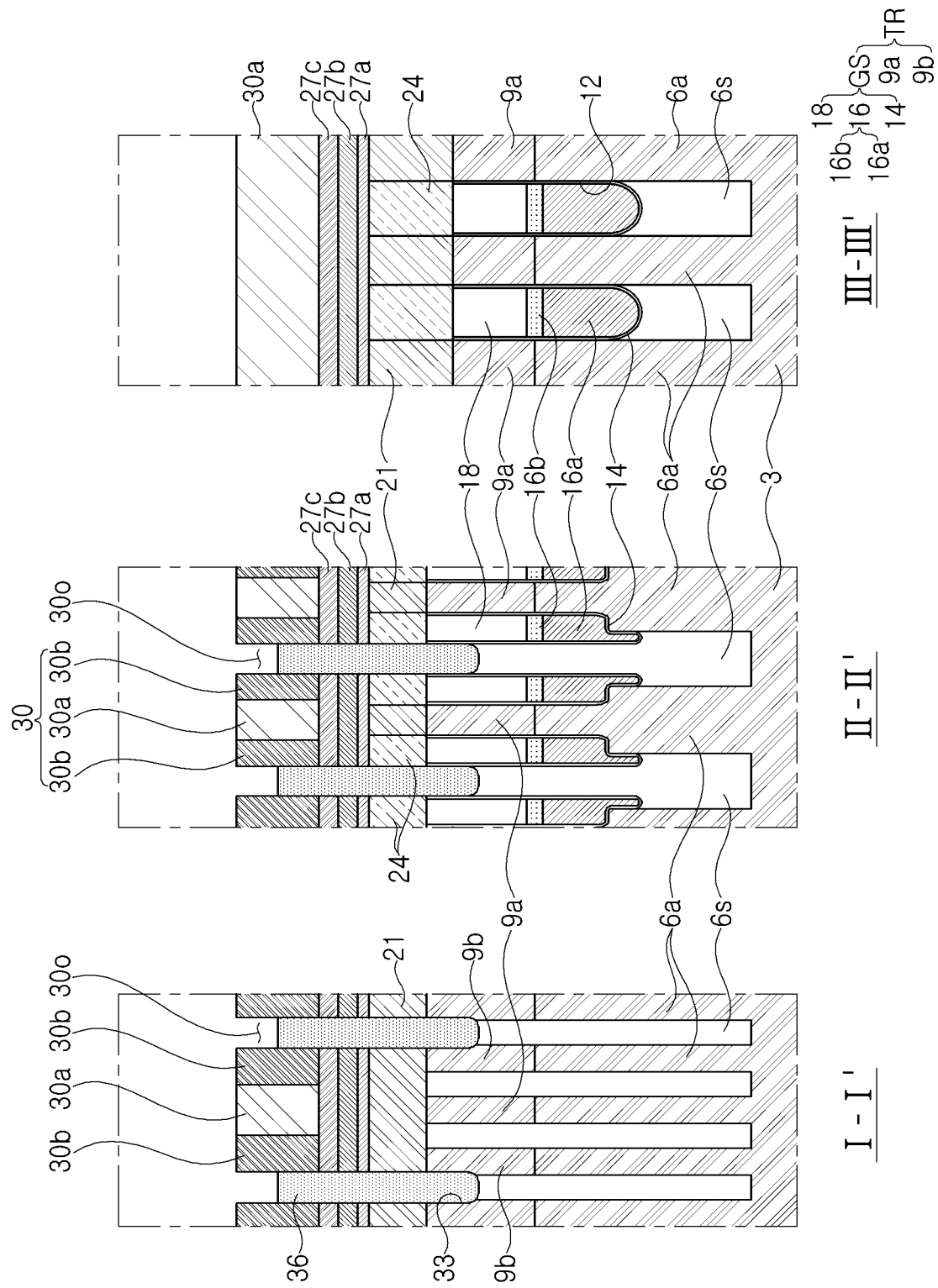

Referring to FIGS. 7, 10A, and 10B, an etching process using the first mask patterns 30 as an etching mask may be performed to form the openings 33.

The etching process using the first mask patterns 30 as an etching mask may include sequentially etching the first to third buffer insulating layers 21a, 21b, and 21c and the pad layer 21, exposed by the mask openings 30o, to form the openings 33.

In operation S30, second barrier patterns 36 may be formed to extend in the diagonal direction D1.

The second barrier patterns 36 may fill the openings 33 and partially fill the mask openings 30o. Forming the second barrier patterns 36 may include filling the openings 33 and the mask openings 30o, forming an insulating material layer to cover the first mask patterns 30, and etching a portion of the insulating material layer to expose upper surfaces of the mask patterns 30.

The second barrier patterns 36 may be formed of the same material (e.g., silicon nitride) as the first barrier patterns 24.

Figure 11:
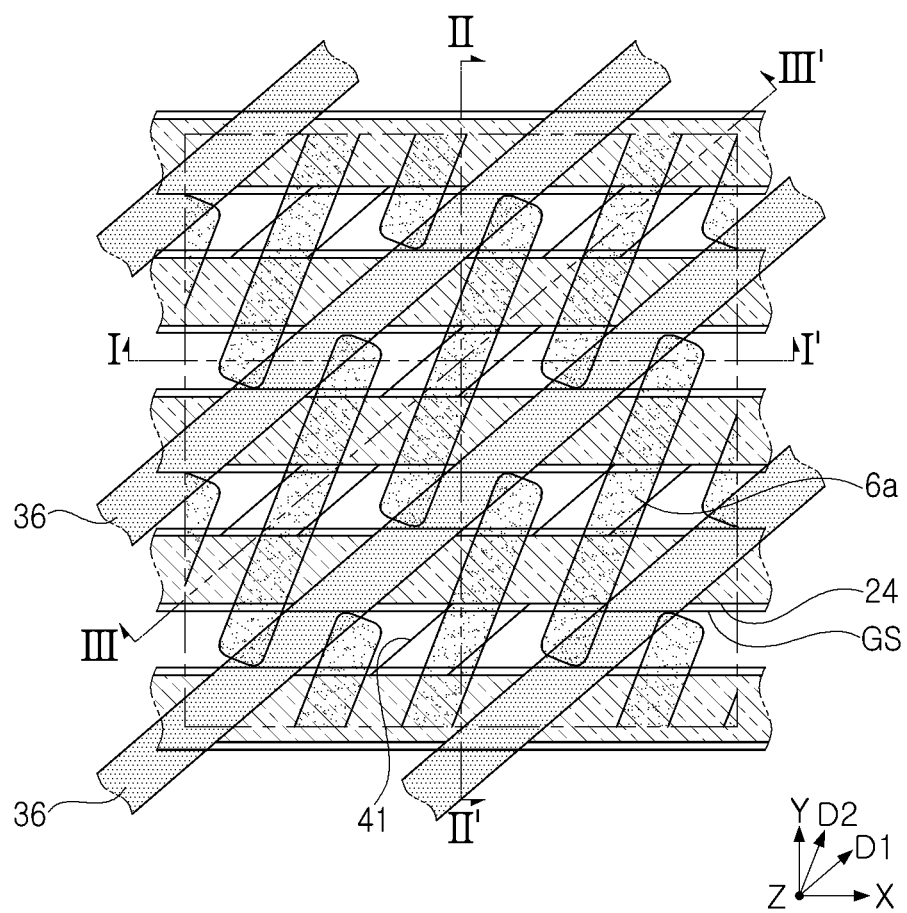
Figure 12A:
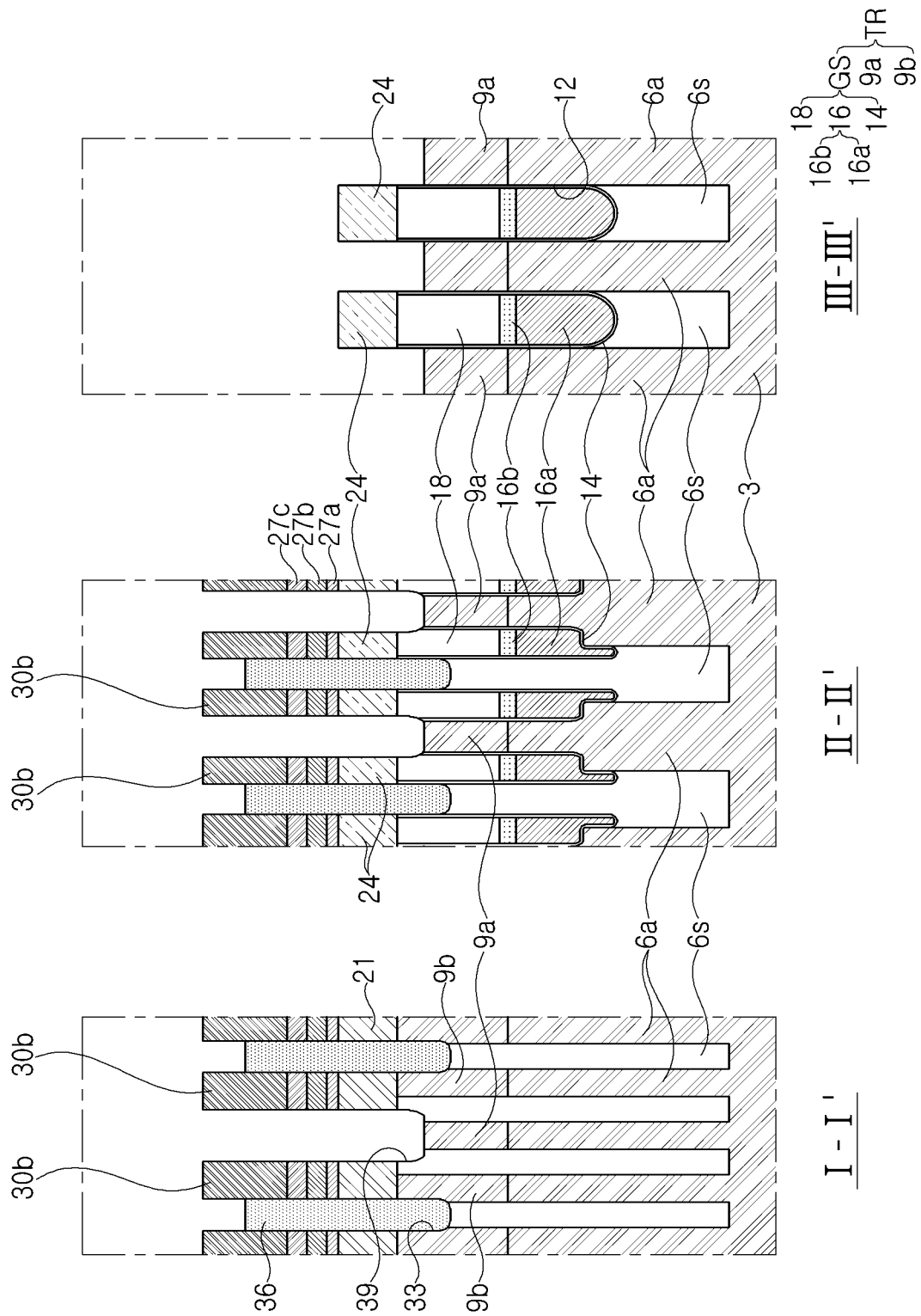

Referring to FIGS. 7, 11, and 12A, the mask lines 30a may be removed using the second barrier patterns 36 and the mask spacers 30b as etching masks. Then, the first to third buffer insulating layers 27a, 27b, and 27c and the pad layer 21 exposed by the openings formed by removing the mask lines 30a, may be sequentially etched such that contact holes 39 are formed to expose the first impurity regions 9a. Bottom surfaces of the contact holes 39 may be disposed at a level, lower than that of upper surfaces of the gate structures GS.

Figure 12B:
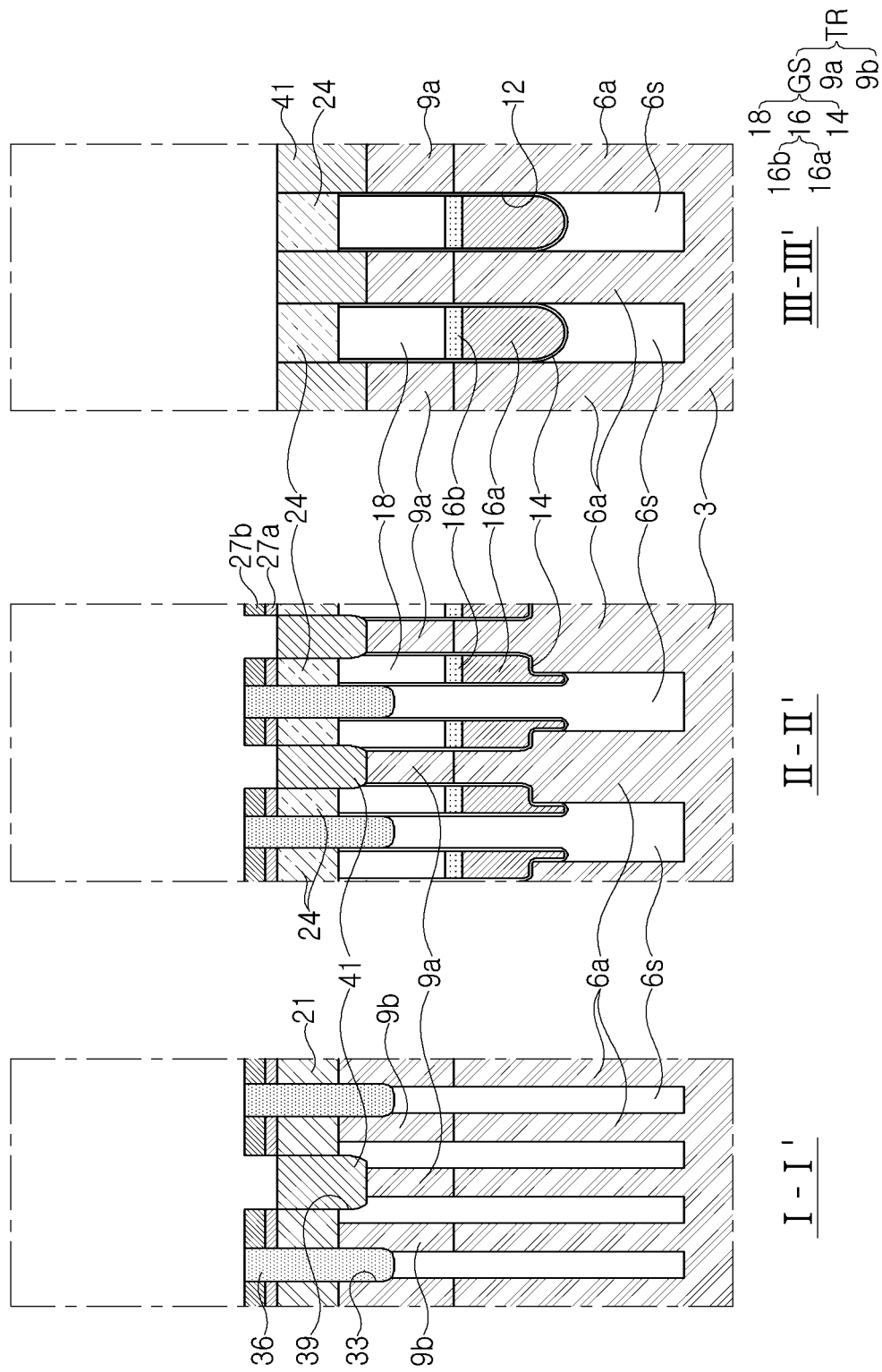

Referring to FIGS. 7, 11 and 12B, in operation S40, first contact plugs 41 may be formed. The first contact plugs 41 may be formed of doped polysilicon, for example, polysilicon having N-type conductivity. During a time when the first contact plugs 41 are formed, the mask spacers 30b may be removed, the third buffer insulating layer 27c may be removed, and the second barrier patterns 36 may be decreased in height.

In an embodiment, the first contact plugs 41 may be recessed to be lower than the first and second buffer insulating layers 27a and 27b.

In an embodiment, the first contact plugs 41 may have upper surfaces, coplanar with upper surfaces of the second buffer insulating layer 27b.

Figure 13:
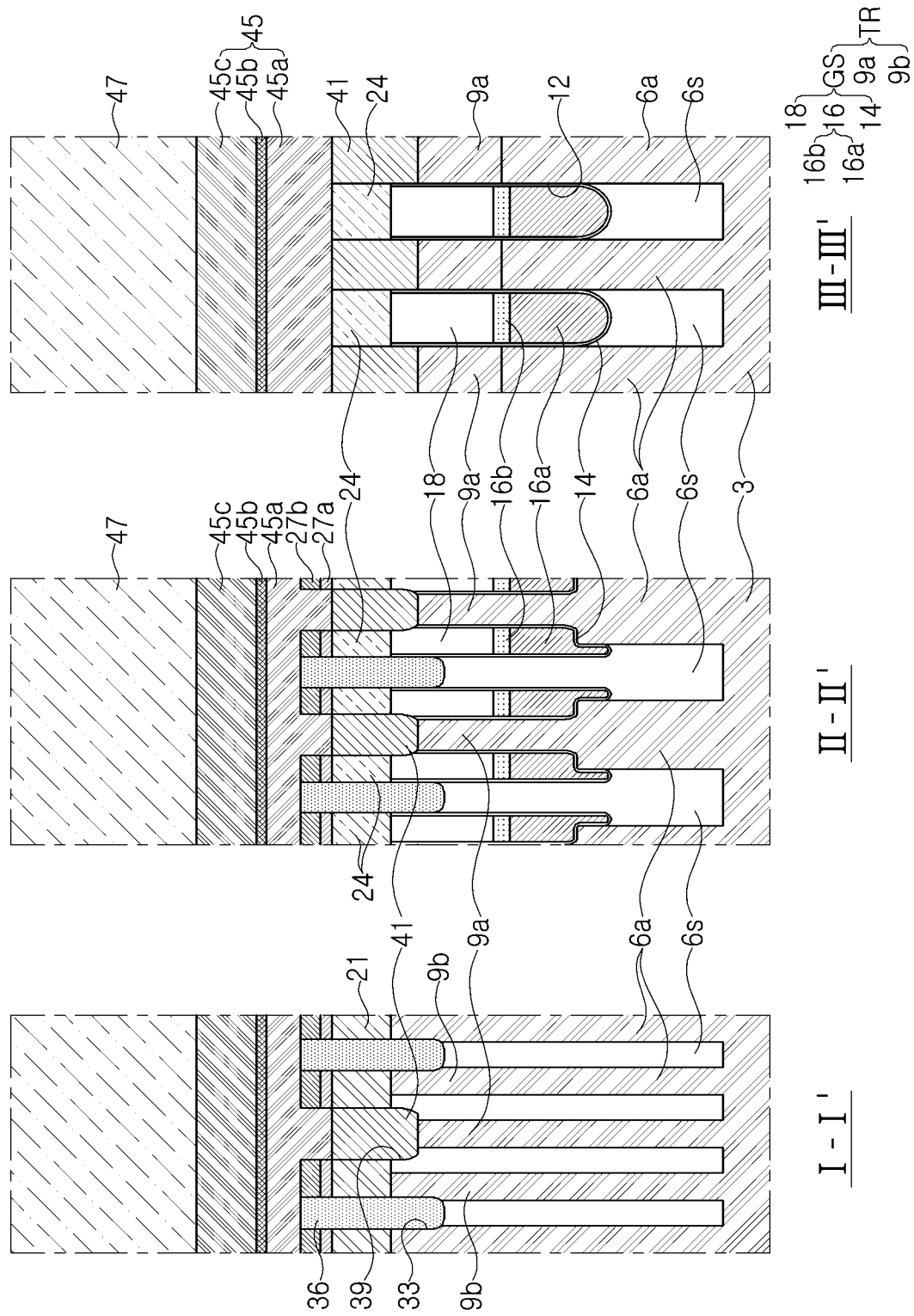

Referring to FIGS. 7, 11, and 13, first to third conductive layers 45a, 45b, and 45c and a bitline capping layer 47 may be formed to be sequentially stacked on the semiconductor substrate 3 with the first contact plugs 41 formed thereon. In an embodiment, the first to third conductive layers 45a, 45b, and 45c and the bitline capping layer 47 may be formed on the semiconductor substrate 3 on which the first contact plugs 41 are formed in a previous operation. The first conductive layer 45a may be formed of doped polysilicon, for example, polysilicon having N-type conductivity. The second conductive layer 45b may include at least one of a metal-semiconductor compound layer and a conductive barrier layer. The third conductive layer 45c may include or may be formed of metal such as W. The bitline capping layer 47 may include or may be formed of an insulating material, for example, silicon nitride.

Figure 14:
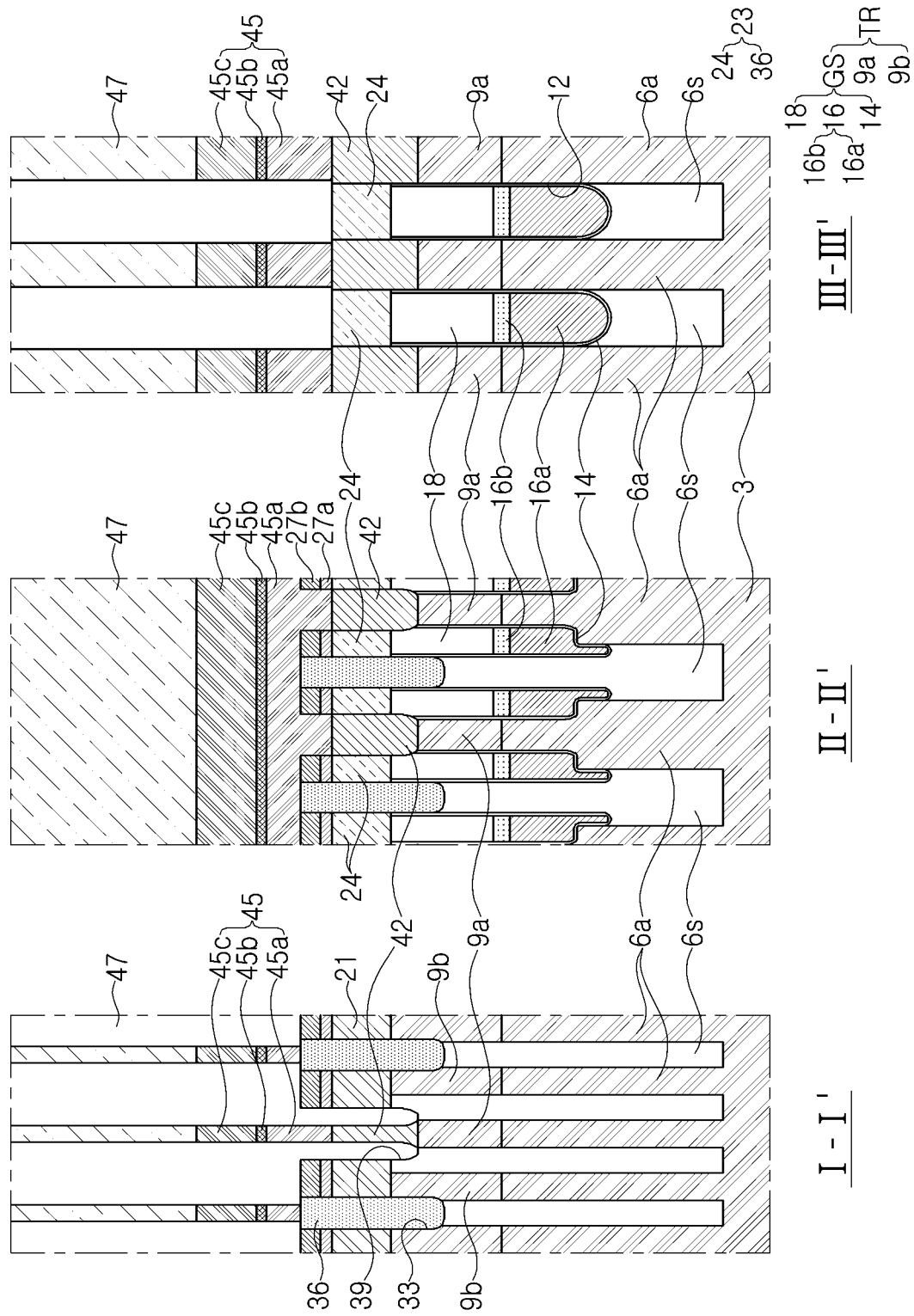

Referring to FIGS. 7, 11, and 14, in operation S50, bitlines 45 may be formed to extend in a second direction Y.

Forming of the bitlines 45 may include patterning the first to third conductive layers 45a, 45b, and 45c and the bitline capping layer 47 in a line shape. Accordingly, each of the bitlines 45 may include the first to third conductive layers 45a, 45b, and 45c sequentially stacked on each other.

The first contact plugs 41, disposed below the bitlines 45, may be patterned together. Accordingly, the first contact plugs 41 may remain below the bitlines 45.

Figure 15:
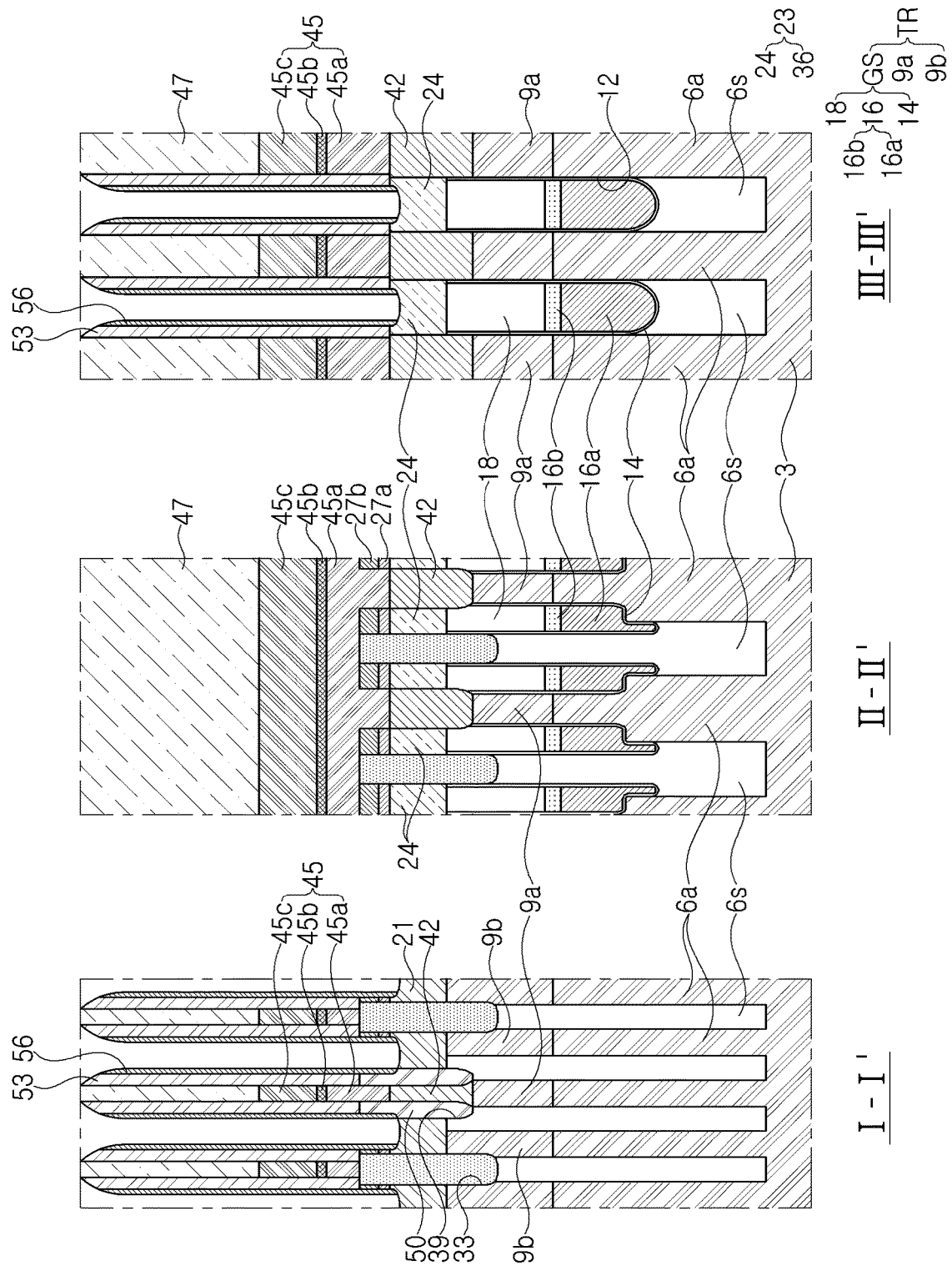

Referring to FIGS. 7, 11, and 15, contact spacers 50 may be formed to fill at least a space between the first contact plugs 41 and the pad layers 21. Bitline spacers 53 may be formed on side surfaces of the bitlines 45 and the bitline capping layers 47 sequentially stacked on each other. A portion of the first and second buffer insulating layers 27a and 27b on opposite sides of the structure including the bitlines 45 and the bitline spacers 53 may be etched during a time when the bitline spacers 53 are formed.

Insulative liners 56 may be formed to cover external surfaces of the bitline spacers 53. The insulating liners 56 may be formed of an insulating material such as a silicon nitride.

Returning to FIGS. 1A, 1B, 1C, and 2 together with FIG. 7, insulating fences 59 may be formed to be disposed between the bitlines 45 and between the bitline capping layers 47 and to expose the pad layers 21 in contact with the second impurity regions 9b. The insulating fences 59 may be formed of an insulating material such as a silicon nitride.

In operation S60, second contact plugs 64 may be formed. The second contact plugs 64 may be formed on the pad layers 21.

In an example, each of the second contact plugs 64 may include first to third conductive layers 64a, 64b, and 64c sequentially stacked on each other. The first conductive layer 64a may include or may be formed of doped polysilicon, for example, polysilicon having N-type conductivity. The second conductive layer 64b may include or may be formed of a metal-semiconductor compound layer. For example, the metal-semiconductor compound layer may include at least one of WSi, TiSi, TaSi, NiSi, and CoSi. The third conductive layer 64c may include a plug pattern and a conductive barrier layer covering a side surface and a bottom surface of the plug pattern. The conductive barrier layer may include or may be formed of at least one of TiN, TaN, WN, TiSiN, TaSiN, and RuTiN, and the plug pattern may include or may be formed of a metal material such as W.

In operation S70, a data storage structure may be formed. The data storage structure may be a structure for storing data in a memory device such as a DRAM or an MRAM. For example, when the semiconductor device 1 is a memory device such as a DRAM, the data storage structure may be a cell capacitor of a DRAM. In an embodiment, the data storage structure may include a lower electrode, an upper electrode, and a dielectric layer between the lower electrode and the upper electrode. The lower electrode may be electrically connected to the second impurity region 9b via the second contact plug 64 and the pad layer 21. For example, the lower electrode may contact the second contact plug 64 that contacts the pad layer 21, and the pad layer 21 may contact the second impurity region 9b.

Next, an example of a method of forming the semiconductor device 1' described with reference to FIGS. 4A to 5 will be described with reference to FIGS. 16 to 20. In the drawings, FIG. 16 is a process flowchart illustrating a method of forming a semiconductor device according to an example embodiment, FIGS. 17A, 18A, and 19A are schematic plan views illustrating a method of forming a semiconductor device according to an example embodiment, and FIGS. 17B, 18B, 19B, and 20 are schematic cross-sectional views of regions taken along lines Ia-Ia', IIa-IIa', and IIIa-IIIa' of FIG. 4A for illustrating a method of forming a semiconductor device according to an example embodiment.

Figure 16:
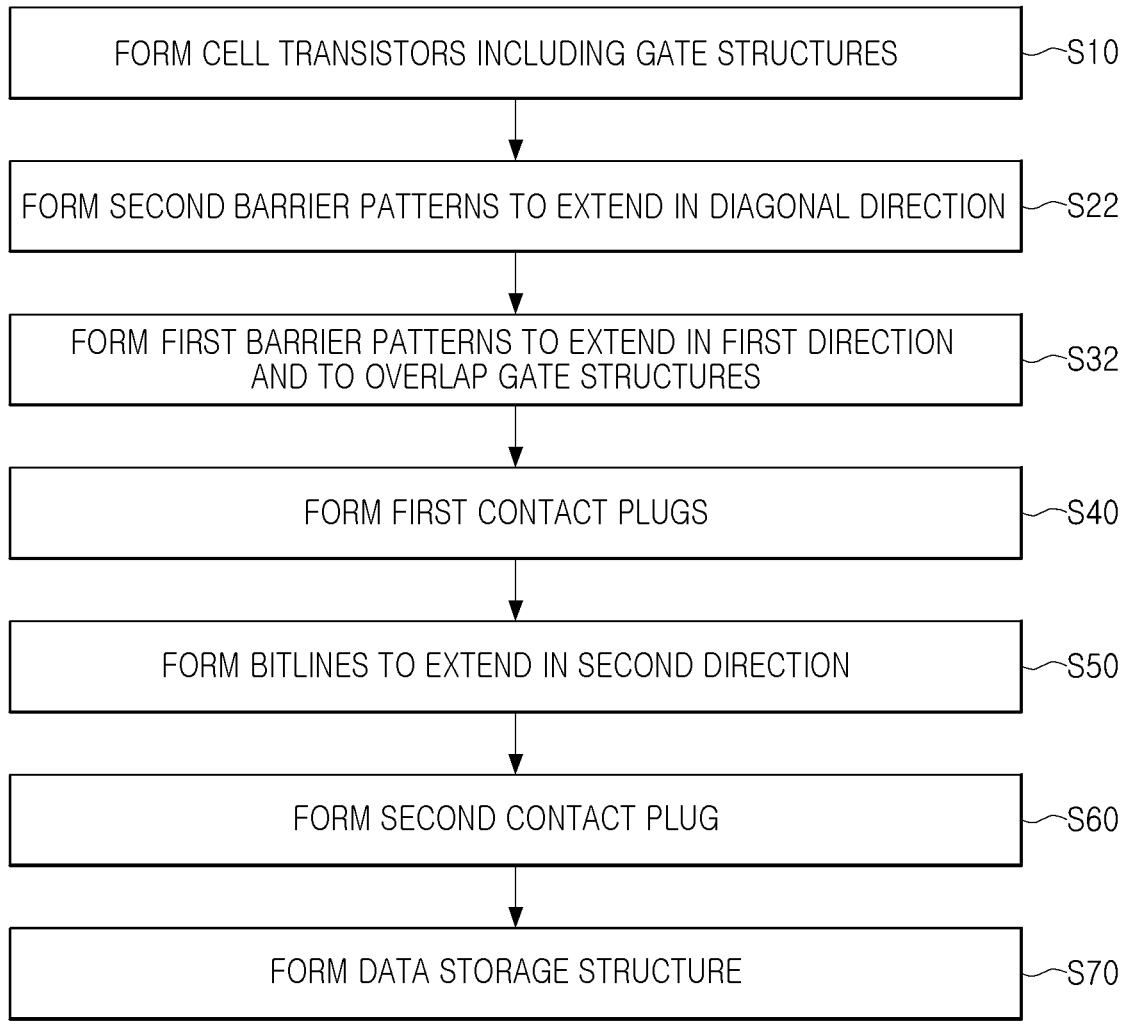
FIGS. 16 to 20 are diagrams illustrating an example of a method of forming a modified example of a semiconductor device according to an example embodiment.
Figure 17A:
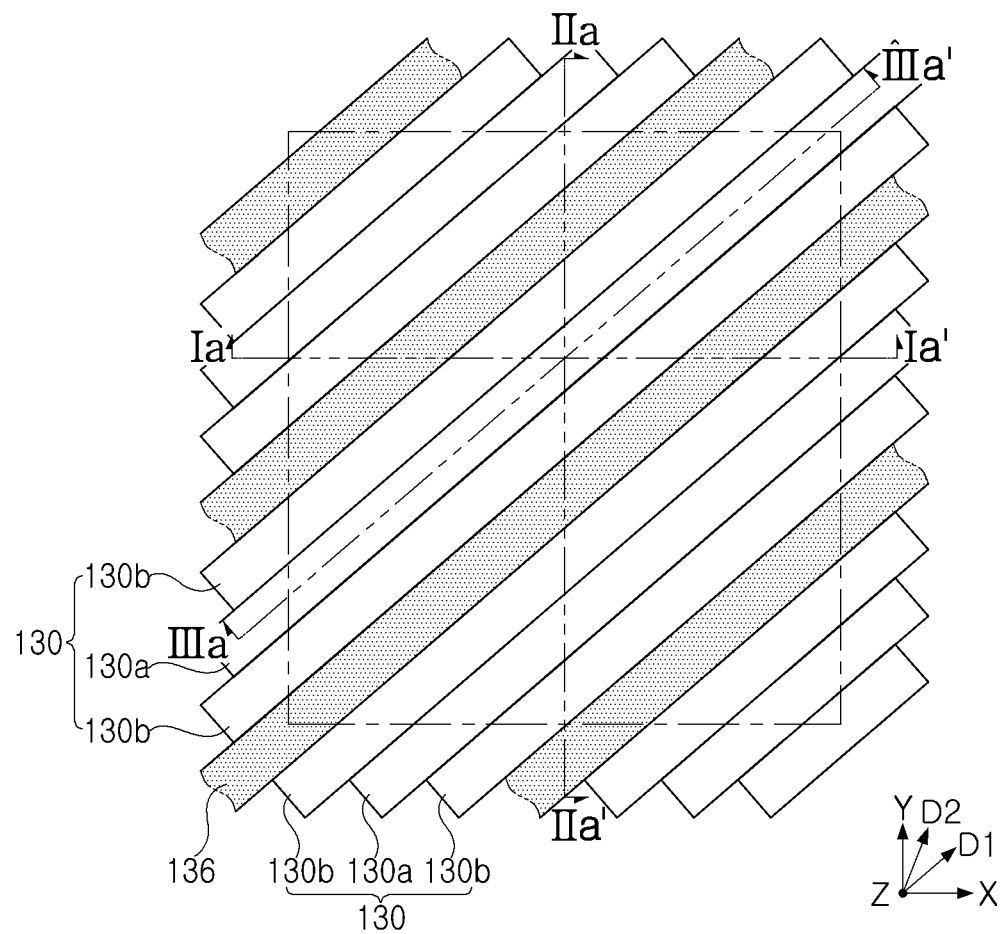
Figure 17B:
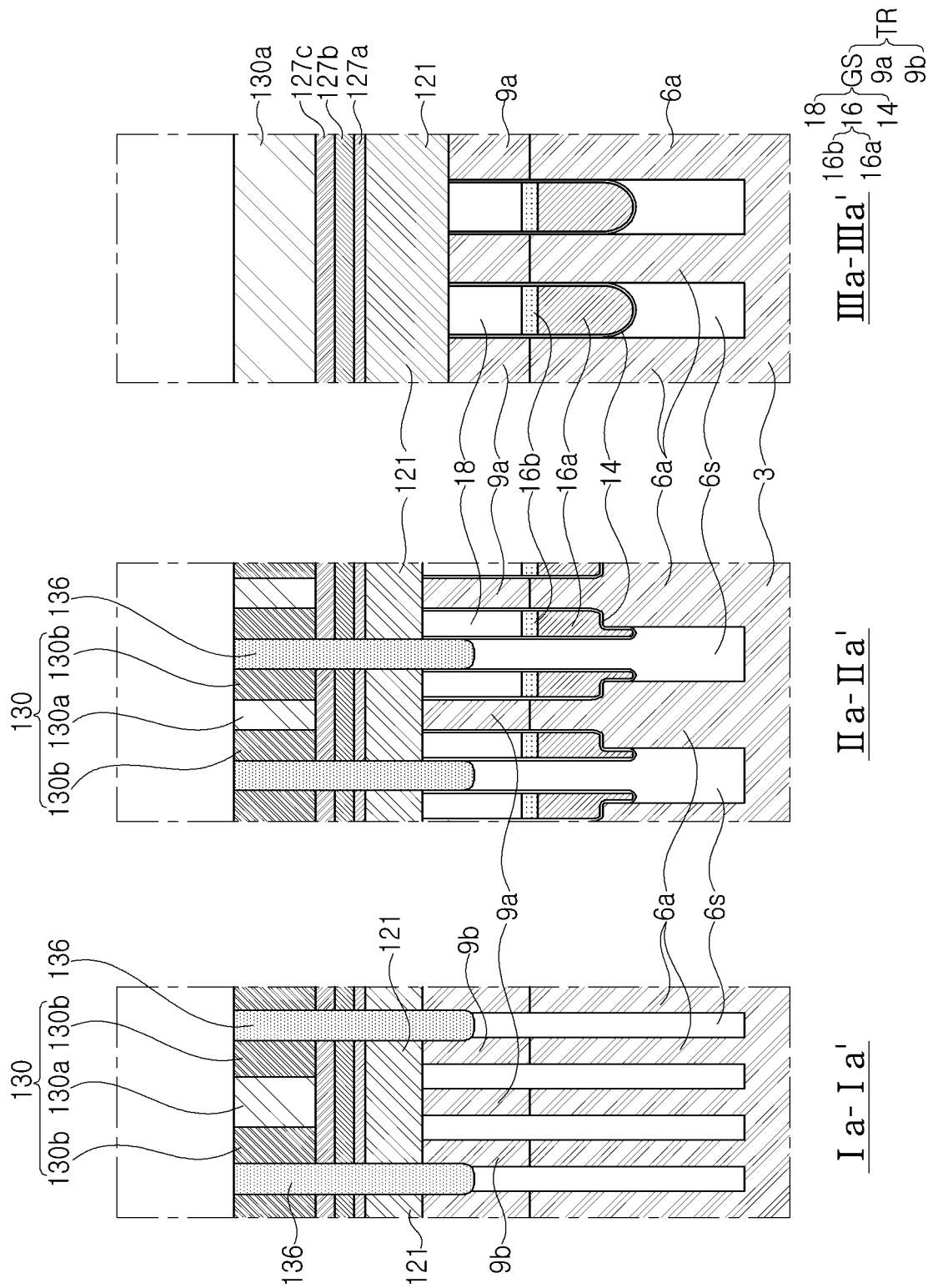
Figure 18A:
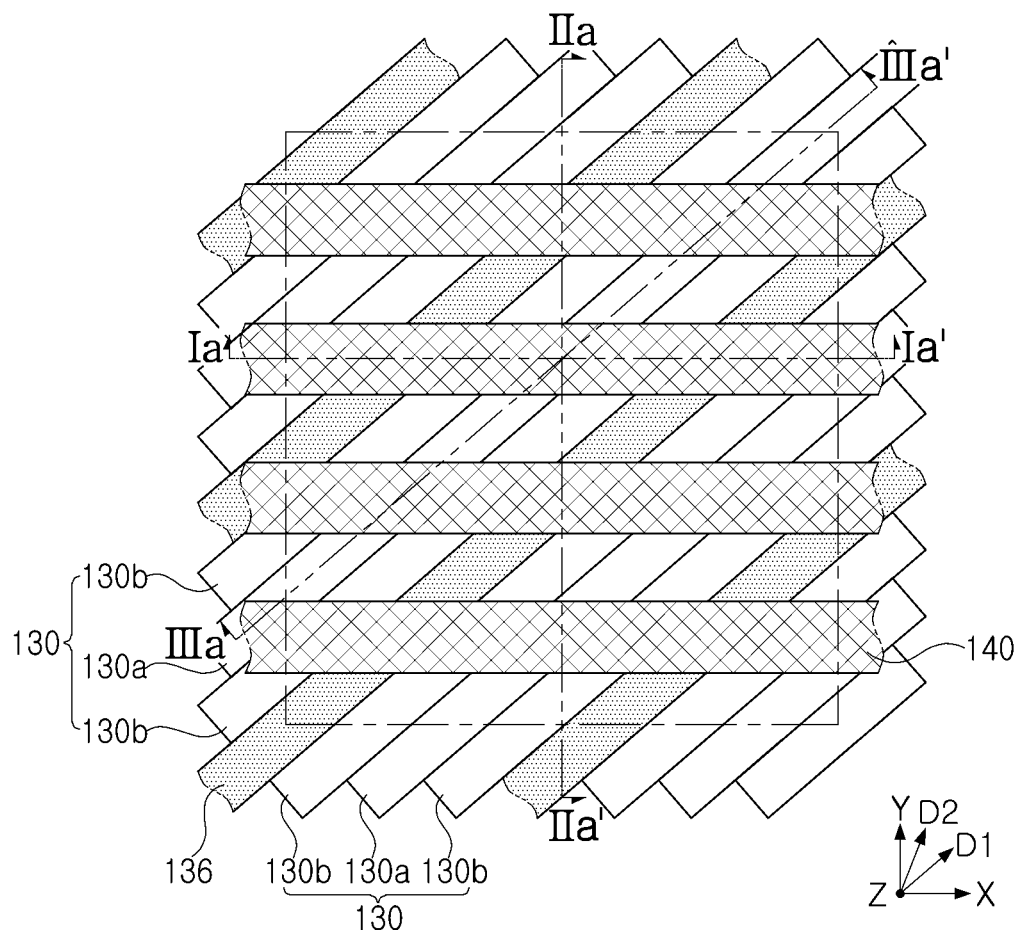

Referring to FIGS. 16, 17A, and 17B, in operation S10, the cell transistors TR may be formed as described with reference to FIG. 16. After the cell transistors TR are formed, a pad layer 121 may be formed. The pad layer 121 may be formed of polysilicon having N-type conductivity.

First to third buffer insulating layers 127a, 127b, and 127c may be formed to be sequentially stacked on the pad layer 121.

First mask patterns 130, substantially the same as the first mask patterns 30 as described with reference to FIGS. 7, 9A and 9B, may be formed on the third buffer insulating layer 127. The first mask patterns 130 may include a mask line 130a, extending in a diagonal direction D1, and mask spacers 130b covering opposite side surfaces of the mask line 130a. The mask spacers 130b may be formed of a material, different from that of the mask line 130a.

In operation S22, the second barrier patterns 136 may be formed to extend in the diagonal direction D1.

Forming of the second barrier patterns 136 may include sequentially etching the first to third buffer insulating layers 21a, 21b, and 21c through an etching process using the first mask patterns 130 as etching masks to form openings and filling the openings with an insulating material. The second barrier patterns 136 may be formed of silicon nitride.

Figure 18B:
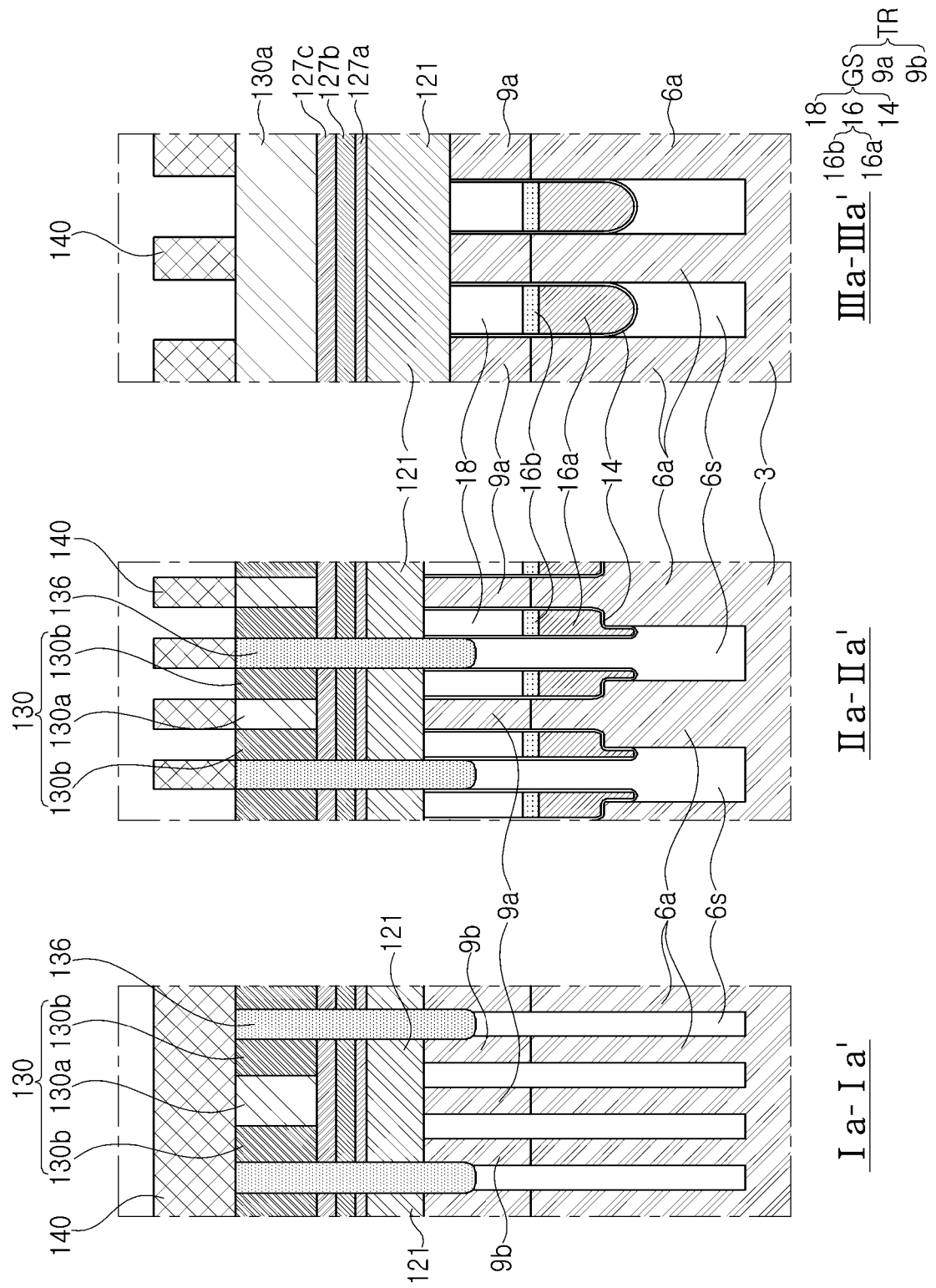
Figure 19A:
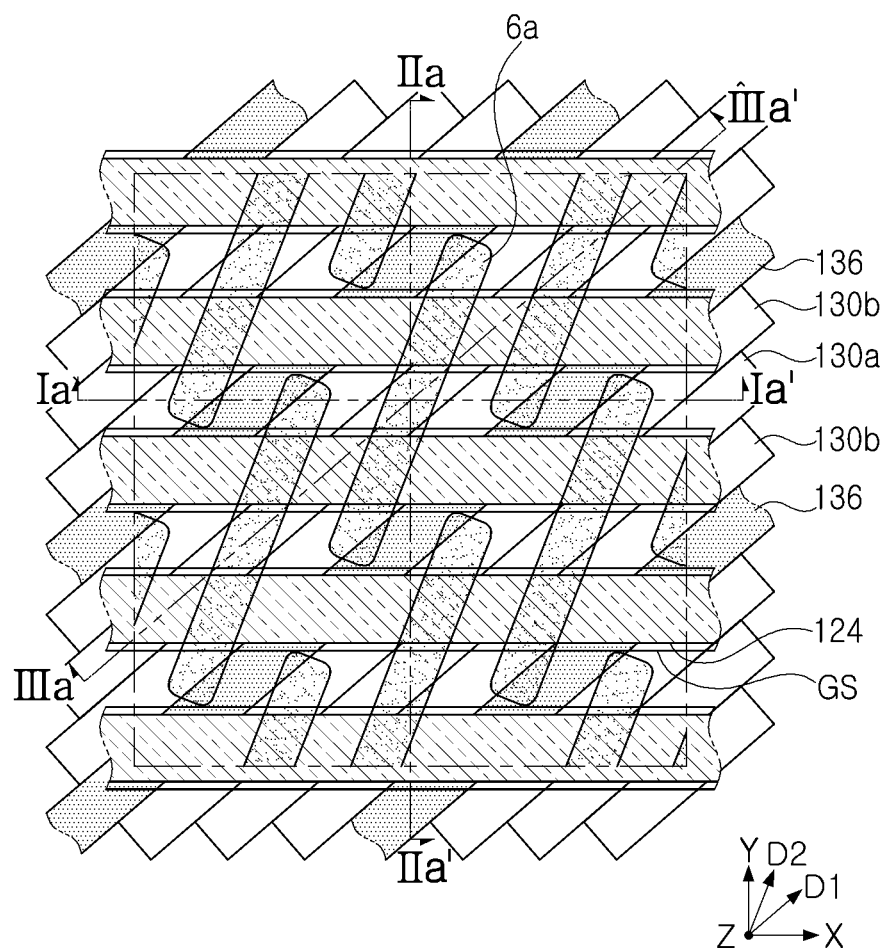

Referring to FIGS. 16, 18A, and 18B, second mask patterns 140 may be formed on the first mask patterns 130 and the second barrier patterns 136 to extend in a first direction X.

Figure 19B:
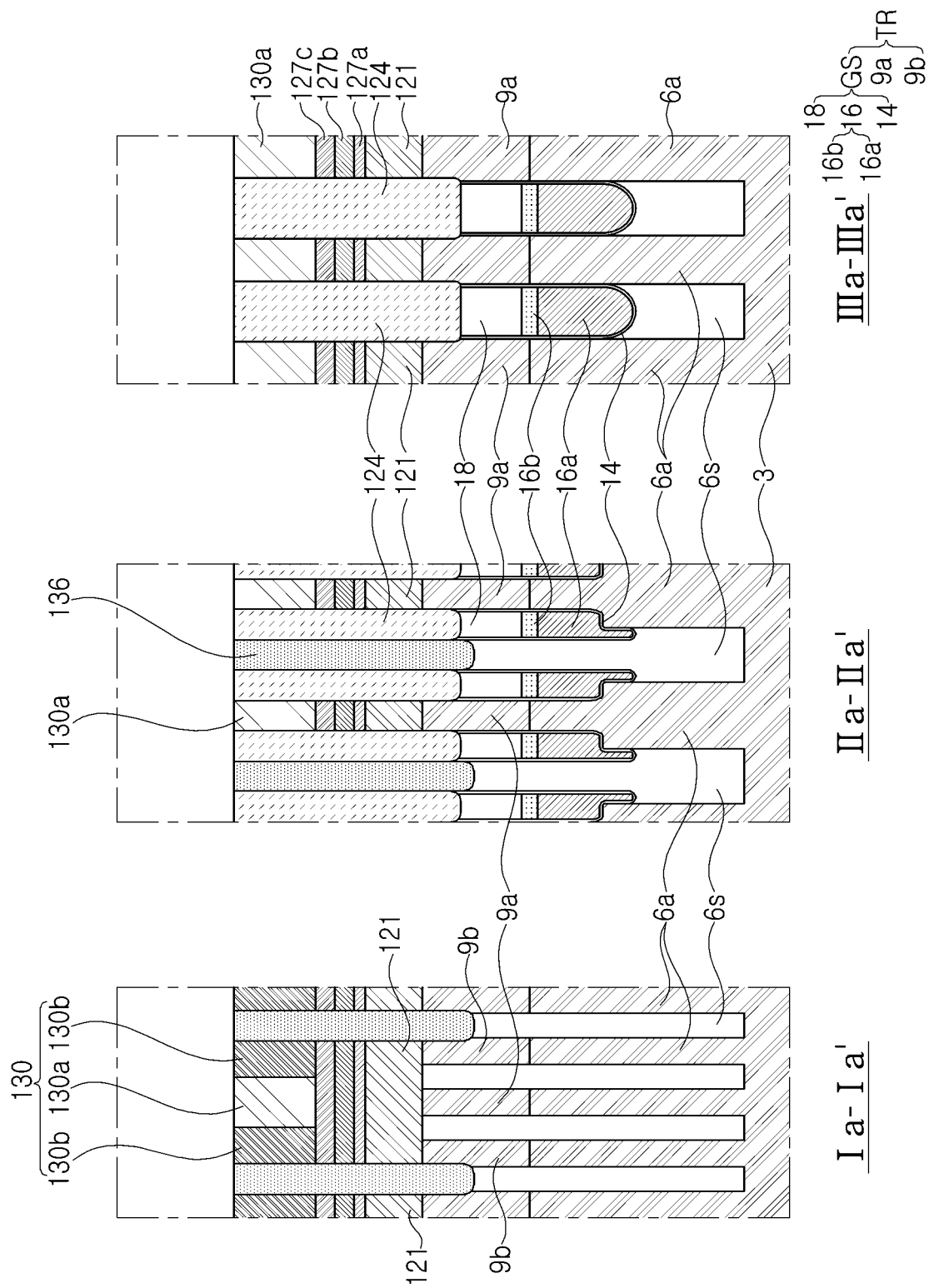

Referring to FIGS. 16, 19A, and 19B, in operation S32, the first barrier patterns 124 may be formed to extend in the first direction X and to overlap the cell gate structures GS.

Forming the first barrier patterns 124 may include performing an etching process using the second mask patterns 140 of FIGS. 18A and 18B as etching masks to form openings and filling the openings with an insulating material. Lower surfaces of the first barrier patterns 124 may be disposed at a level, lower than that of a lower surface of the pad layer 121. The second mask patterns 140 of FIGS. 18A and 18B may be removed.

The mask lines 130a may be formed as patterns separated from each other by the first barrier patterns 124.

Figure 20:
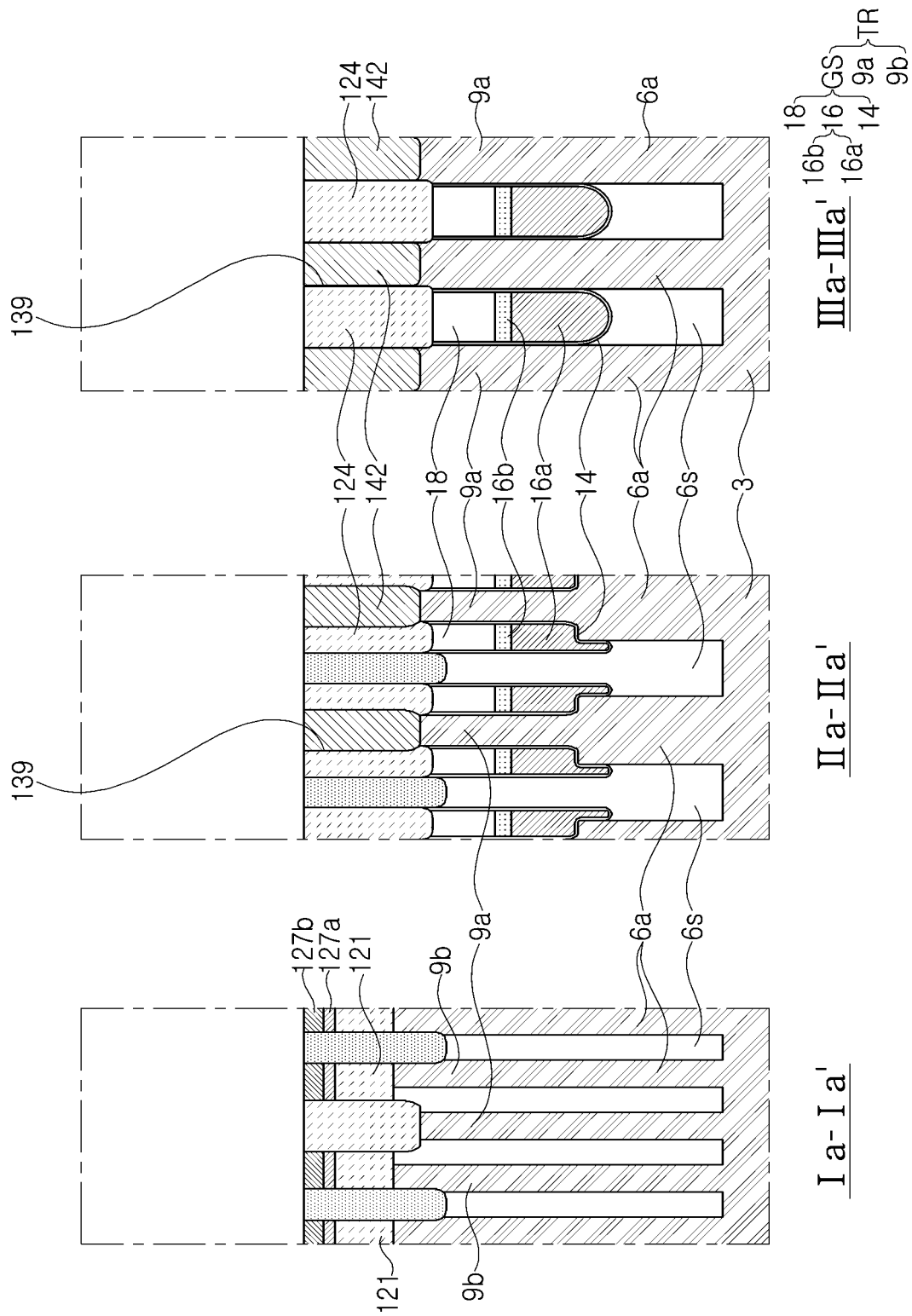

Referring to FIGS. 16 and 20, in operation S40, first contact plugs 141 may be formed. Forming of the first contact plugs 141 may include selectively removing the mask lines 130a, forming contact holes 139 by etching the first to third buffer insulating layers 127a, 127b, and 127c and the pad layer 121 exposed by the openings that are formed by removing the mask lines 130a, and forming a conductive material layer to fill the contact holes 139. The first contact plugs 141 may remain in the contact holes 139, respectively. During a time when the first contact plug 141 is formed, a height of the second barrier pattern 126 may be reduced and the remaining mask line 130a, mask spacer 130b, and third buffer insulating layer 127 may be removed.

Returning to FIGS. 4A to 5 together with FIG. 16, in operation S50, bitlines 145 may be formed to extend in a second direction Y. Second contact plugs 164 may be formed in operation S60. In operation S70, a data storage structure may be formed. A forming method from operation S50 of forming the bitlines 145 to operation S70 of forming the data storage structure may be substantially the same as the forming method from operation S50 of forming the bitlines 145 to operation S70 of forming the data storage structure as described with reference to FIG. 7.

According to the above-described embodiment, the barrier structure (23 of FIG. 2 and 123 of FIG. 5) may be formed, so that the contact holes (39 of FIGS. 12A and 139 of FIG. 20) for forming the first contact plugs (42 of FIG. 2 and 142 of FIG. 5) may be formed to be shallow. Therefore, an overall vertical thickness of the first contact plugs (42 of FIG. 2 and 142 of FIG. 5) may be reduced. As a result, an overall thickness of the semiconductor devices 1 and 1' may be reduced.

As described above, a semiconductor device may be provided with a barrier structure including a first barrier pattern, extending in a first direction, and a second barrier pattern extending in a first diagonal direction forming an acute angle with the first direction. Such a barrier structure may expose impurity regions formed in an active region, and may improve reliability of contact plugs which may be electrically connected to the impurity regions. For example, the barrier structure may be disposed to reduce the difficulty of a process for forming the contact plugs and to prevent defects. For example, the barrier structure may be disposed to prevent leakage between the contact plugs. Accordingly, a semiconductor device including a reliable contact plug may be provided.

In addition, the barrier structure may be disposed, so that the contact plugs may be formed to have a uniform size. Therefore, distribution characteristics in electrical properties such as contact resistance of the contact plugs may be improved.

In addition, the barrier structure may be disposed, so that contact holes for forming the contact plugs may be formed to be shallow. Therefore, an overall vertical thickness of the contact plugs may be reduced. As a result, an overall thickness of the semiconductor device may be reduced.

While example embodiments have been shown and described above, it will be apparent to those skilled in the art that modifications and variations could be made without departing from the scope of the present inventive concept as defined by the appended claims.

What is claimed is:
1. A semiconductor device comprising:
a semiconductor substrate provided with a plurality of active regions;
an isolation layer defining each of the plurality of active regions on the semiconductor substrate;
a plurality of gate trenches intersecting the plurality of active regions and extending to the isolation layer;
a plurality of gate structures filling the plurality of gate trenches, respectively, and extending in a first direction parallel to an upper surface of the semiconductor substrate;
an insulating barrier structure disposed on the plurality of active regions, the isolation layer, and the plurality of gate structures;
a bitline extending in a second direction perpendicular to the first direction and parallel to the upper surface of the semiconductor substrate, and disposed at a level higher than a level of where the insulating barrier structure is disposed; and
a plurality of first contact plugs, each first contact plug being between the bitline and a first portion of a corresponding active region of the plurality of active regions,
wherein the insulating barrier structure comprises:
a plurality of first barrier patterns parallel to each other, overlapping the plurality of gate structures, and extending in the first direction; and
a plurality of second barrier patterns parallel to each other and extending in a first diagonal direction between the first direction and the second direction, the first diagonal direction being parallel to the upper surface of the semiconductor substrate, and
wherein each of the plurality of first contact plugs is disposed in a region defined by a corresponding pair of first barrier patterns of the plurality of first barrier patterns and a corresponding pair of second barrier patterns of the plurality of second barrier patterns.
2. The semiconductor device of claim 1, wherein:
each of the plurality of active regions extends in a second diagonal direction between the first direction and the second direction, the second diagonal direction being parallel to the upper surface of the semiconductor substrate;
an angle between the first diagonal direction and the first direction is a first acute angle; and
an angle between the second diagonal direction and the first direction is a second acute angle greater than the first acute angle.

3. The semiconductor device of claim 2, wherein:
an angle between the first diagonal direction and the second diagonal direction is a third acute angle; and
the third acute angle is less than the second acute angle.

4. The semiconductor device of claim 3,
wherein the first acute angle is greater than the third acute angle.

5. The semiconductor device of claim 1, wherein:
each of the plurality of first contact plugs has a pair of first side surfaces opposite each other, a pair of second side surfaces opposite each other, and a pair of third side surfaces opposite each other;
the pair of first side surfaces are substantially parallel to a side surface of a corresponding pair of first barrier patterns of the plurality of first barrier patterns;
the pair of second side surfaces are substantially parallel to a side surface of a corresponding pair of second barrier patterns of the plurality of second barrier patterns; and
the pair of third side surfaces are substantially parallel to a side surface of the bitline.

6. The semiconductor device of claim 5, wherein:
the pair of first side surfaces and the pair of second side surfaces of each of the plurality of first contact plugs are connected with each other at a region overlapping a corresponding active region of the plurality of active regions; and
the pair of second side surfaces and the pair of third side surfaces of each of the plurality of first contact plugs are connected with each other at a region overlapping the isolation layer.

7. The semiconductor device of claim 1, wherein:
each of the plurality of first barrier patterns has a first thickness; and
each of the plurality of second barrier patterns has a second thickness different from the first thickness.

8. The semiconductor device of claim 1, wherein:
each of the plurality of first barrier patterns has a first upper surface and a first lower surface; and
each of the plurality of second barrier patterns has a second upper surface, disposed at a level higher than a level of the first upper surface, and a second lower surface disposed at a level lower than a level of the first lower surface.

9. The semiconductor device of claim 1,
wherein each of the plurality of second barrier patterns has a line shape penetrating through the plurality of first barrier patterns and extending in the first diagonal direction.

10. The semiconductor device of claim 1,
wherein each of the plurality of first barrier patterns has a line shape penetrating through the plurality of second barrier patterns and extending in the first direction.

11. The semiconductor device of claim 1,
wherein the plurality of first contact plugs have lower surfaces disposed at a level, higher than a level of lower surfaces of the plurality of second barrier patterns.

12. The semiconductor device of claim 11,
wherein a lower surface of each of the plurality of first contact plugs is disposed at a level, lower than a level of lower surfaces of the plurality of first barrier patterns.

13. The semiconductor device of claim 11,
wherein a lower surface of each of the plurality of first contact plugs is disposed at a level, higher than a level of lower surfaces of the plurality of first barrier patterns.

14. The semiconductor device of claim 1, further comprising:
a plurality of first impurity regions disposed in the plurality of active regions, respectively;
a plurality of second impurity regions disposed in the plurality of active regions, respectively, wherein in each active region of the plurality of active regions, a corresponding first impurity region of the plurality of first impurity regions and a corresponding second impurity region of the plurality of second impurity regions are spaced apart from each other;
a plurality of pad layers on the plurality of second impurity regions, respectively; and
a plurality of second contact plugs on the plurality of pad layers, respectively,
wherein:
the plurality of first contact plugs contact the plurality of first impurity regions, respectively;
the plurality of pad layers contact the plurality of second impurity regions, respectively;
the plurality of pad layers contact the insulating barrier structure; and
each of the plurality of second barrier patterns has a vertical thickness greater than a vertical thickness of each of the plurality of pad layers.

15. A semiconductor device comprising:
a semiconductor substrate provided with an active region;
an isolation layer defining the active region on the semiconductor substrate;
a gate trench intersecting the active region and extending to the isolation layer;
a gate structure filling the gate trench and extending in a first direction parallel to an upper surface of the semiconductor substrate;
an insulating barrier structure disposed on the active region, the isolation layer, and the gate structure;
a bitline extending in a second direction perpendicular to the first direction and parallel to the upper surface of the semiconductor substrate, and disposed at a level higher than a level of the insulating barrier structure; and
a first contact plug between the bitline and a first portion of the active region,
wherein:
the insulating barrier structure is disposed under the bitline;
the insulating barrier structure comprises:
a pair of first barrier patterns spaced apart from each other in the second direction, and
a pair of second barrier patterns spaced apart from each other in the first direction;
the pair of first barrier patterns are disposed between the pair of second barrier patterns; and
the first contact plug is disposed between the pair of first barrier patterns.

16. The semiconductor device of claim 15,
wherein the pair of second barrier patterns have lower surfaces disposed at a level, different from a level of lower surfaces of the pair of first barrier patterns.

17. The semiconductor device of claim 15, wherein:
the pair of first barrier patterns extend in the first direction; and
the pair of second barrier patterns extend in a first diagonal direction parallel to the upper surface of the semiconductor substrate,
an angle between the first diagonal direction and the first direction is an acute angle.

18. The semiconductor device of claim 15, further comprising:
a first impurity region and a second impurity region disposed in the active region and spaced apart from each other;
a pad layer on the second impurity region; and
a second contact plug on the pad layer,
wherein:
the first contact plug is in contact with the first impurity region;
the pad layer is in contact with the second impurity region;
the pad layer is in contact with the insulating barrier structure; and
the pair of second barrier patterns have a vertical thickness, greater than a vertical thickness of the pad layer.

19. A semiconductor device comprising:
a semiconductor substrate provided with a plurality of active regions;
an isolation layer defining each of the plurality of active regions on the semiconductor substrate;
a plurality of gate trenches intersecting the plurality of active regions and extending to the isolation layer;
a plurality of gate structures filling the plurality of gate trenches, respectively, and extending in a first direction parallel to an upper surface of the semiconductor substrate;
a first impurity region and a second impurity region disposed in each of the plurality of active regions and spaced apart from each other;
an insulating barrier structure disposed on the plurality of active regions, the isolation layer, and the plurality of gate structures;
a bitline extending in a second direction perpendicular to the first direction and parallel to the upper surface of the semiconductor substrate, and disposed at a level higher than a level of where the insulating barrier structure is disposed;
a first contact plug between the first impurity region and the bitline;
a pad layer on the second impurity region; and
a second contact plug on the pad layer,
wherein the insulating barrier structure comprises:
a pair of first barrier patterns extending in the first direction parallel to each other, and overlapping the plurality of gate structures; and
a pair of second barrier patterns parallel to each other and extending in a first diagonal direction between the first direction and the second direction and parallel to the upper surface of the semiconductor substrate, and
wherein the first contact plug is disposed in a region defined by the pair of first barrier patterns and the pair of second barrier patterns.

20. The semiconductor device of claim 19, wherein:
each of the plurality of active regions extends in a second diagonal direction between the first direction and the second direction, the second diagonal direction being parallel to the upper surface of the semiconductor substrate;
an angle between the first diagonal direction and the first direction is a first acute angle;
an angle between the second diagonal direction and the first direction is a second acute angle greater than the first acute angle;
each of the pair of first barrier patterns has a first thickness; and
each of the pair of second barrier patterns has a second thickness, different from the first thickness.

* * * * *